(12) United States Patent
Gavens et al.

(10) Patent No.: US 10,656,872 B2
(45) Date of Patent: May 19, 2020

(54) STORAGE DEVICE WITH MULTI-DIE MANAGEMENT

(71) Applicant: WESTERN DIGITAL TECHNOLOGIES, INC., San Jose, CA (US)

(72) Inventors: Lee Gavens, Milpitas, CA (US); Yoav Weinberg, Thornhill (CA); Meiqing He, Fremont, CA (US)

(73) Assignee: Western Digital Technologies, Inc., Plano, TX (US)

( * ) Notice: Subject to any disclaimer, the term of this patent is extended or adjusted under 35 U.S.C. 154(b) by 136 days.

(21) Appl. No.: 15/922,689

(22) Filed: Mar. 15, 2018

(65) Prior Publication Data

US 2019/0286364 A1    Sep. 19, 2019

(51) Int. Cl.
*G06F 3/06* (2006.01)
*H01L 27/105* (2006.01)

(52) U.S. Cl.
CPC .......... *G06F 3/0655* (2013.01); *G06F 3/061* (2013.01); *G06F 3/0679* (2013.01); *H01L 27/1052* (2013.01)

(58) Field of Classification Search
CPC ...... G06F 3/0655; G06F 3/061; G06F 3/0679; H01L 27/1052
See application file for complete search history.

(56) References Cited

U.S. PATENT DOCUMENTS

| | | | |
|---|---|---|---|
| 6,240,492 B1 * | 5/2001 | Foster | G06F 13/4243 711/149 |
| 7,506,075 B1 * | 3/2009 | Armstrong | G06F 3/0613 710/36 |
| 8,918,595 B2 * | 12/2014 | Ebsen | G06F 3/0659 711/103 |
| 9,424,073 B1 * | 8/2016 | Schulz | G06F 13/16 |
| 2003/0074530 A1 * | 4/2003 | Mahalingaiah | G06F 9/30152 711/117 |
| 2011/0179240 A1 * | 7/2011 | Sukonik | G06F 13/18 711/158 |
| 2015/0134882 A1 * | 5/2015 | Lin | G06F 3/0679 711/103 |
| 2015/0134883 A1 | 5/2015 | Lin | |
| 2015/0134884 A1 | 5/2015 | Lin et al. | |
| 2015/0234756 A1 | 8/2015 | Tuers et al. | |
| 2016/0162186 A1 * | 6/2016 | Kashyap | G06F 3/061 711/103 |
| 2016/0292092 A1 | 10/2016 | Gavens et al. | |
| 2016/0371183 A1 * | 12/2016 | Long | G06F 3/0659 |
| 2017/0228167 A1 * | 8/2017 | Manohar | G06F 3/0688 |
| 2018/0293101 A1 * | 10/2018 | Park | G06F 13/1673 |

* cited by examiner

*Primary Examiner* — William E. Baughman
(74) *Attorney, Agent, or Firm* — Vierra Magen Marcus LLP

(57) ABSTRACT

An example of a system includes a plurality of non-volatile memory dies, a memory bus coupled to the plurality of non-volatile memory dies, and one or more control circuits coupled to the plurality of non-volatile memory dies through the memory bus. The one or more control circuits include a plurality of die-specific request queues configured in a one-to-one correspondence with the plurality of non-volatile memory dies. The one or more control circuits are configured to add die-specific atomic requests to individual die-specific request queues of the plurality of die-specific request queues independently of each other in response to die-specific triggering events.

21 Claims, 16 Drawing Sheets

STORAGE DEVICE WITH MULTI-DIE MANAGEMENT

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A data storage device may include semiconductor memory that is formed on multiple dies, for example, multiple NAND flash memory dies. Two or more dies may be connected by a memory bus to control and/or interface circuits. Multiple busses, each connected to multiple dies may be used to form large storage devices, e.g. a solid-state drive (SSD).

A data storage device may include one or more control circuits that facilitate operation of semiconductor memory and interfacing with host devices. For example, a data storage device may include a memory controller that executes code (e.g. firmware) to carry out operations directed to a non-volatile memory (e.g. access operations such as read and write operations). Control circuits may include interface circuits that facilitate efficient use of memory busses and memory dies in a multi-die arrangement.

BRIEF DESCRIPTION OF THE DRAWINGS

Like-numbered elements refer to common components in the different figures.

DETAILED DESCRIPTION

In some examples of the present technology, request queues for multiple non-volatile memory dies are managed by a die manager independently of each other so that die-specific requests to non-volatile memory dies may be rapidly sent to the respective dies as die-specific triggering events occur that provide opportunities for a die to accept new requests. A die manager routine may be initiated by specific triggering events and may generate die-specific atomic requests from die-specific access requests received from request generators. Die-specific access requests for a die may be queued in a first request queue prior to being acted on by the die manager. Die-specific atomic requests generated from the die-specific access requests in the first request queue may be queued in a second request queue and may be taken from the second request queue in order. A die manager may reorder such die-specific requests prior to adding them to the second request queue and may interleave atomic requests of different access requests. Triggering events may include events that indicate a possible opportunity to add atomic requests to respective second request queues. Examples of triggering events may include detection of available space in a second request queue, expiration of a write timer, completion of a write transfer, completion of a last cache operation, and receipt of a new die-specific access request.

Figure 1:
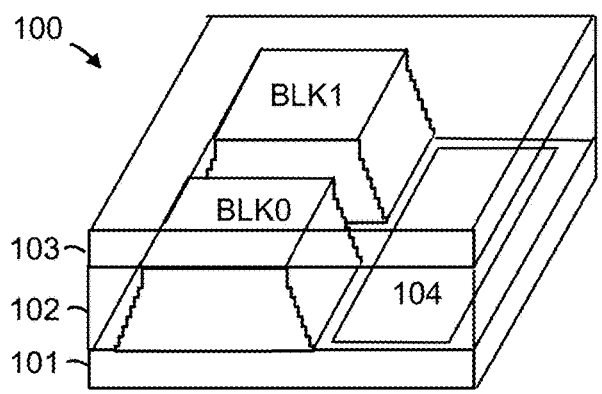
FIG. 1 is a perspective view of a 3D stacked non-volatile memory device.

FIGS. 1-4 describe one example of a memory system that can be used to implement the technology proposed herein. FIG. 1 is a perspective view of a three-dimensional (3D) stacked non-volatile memory device. The memory device 100 includes a substrate 101. On and above the substrate are example blocks of memory cells, including BLK0 and BLK1, formed of memory cells (non-volatile storage elements). Also, on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block of memory cells comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
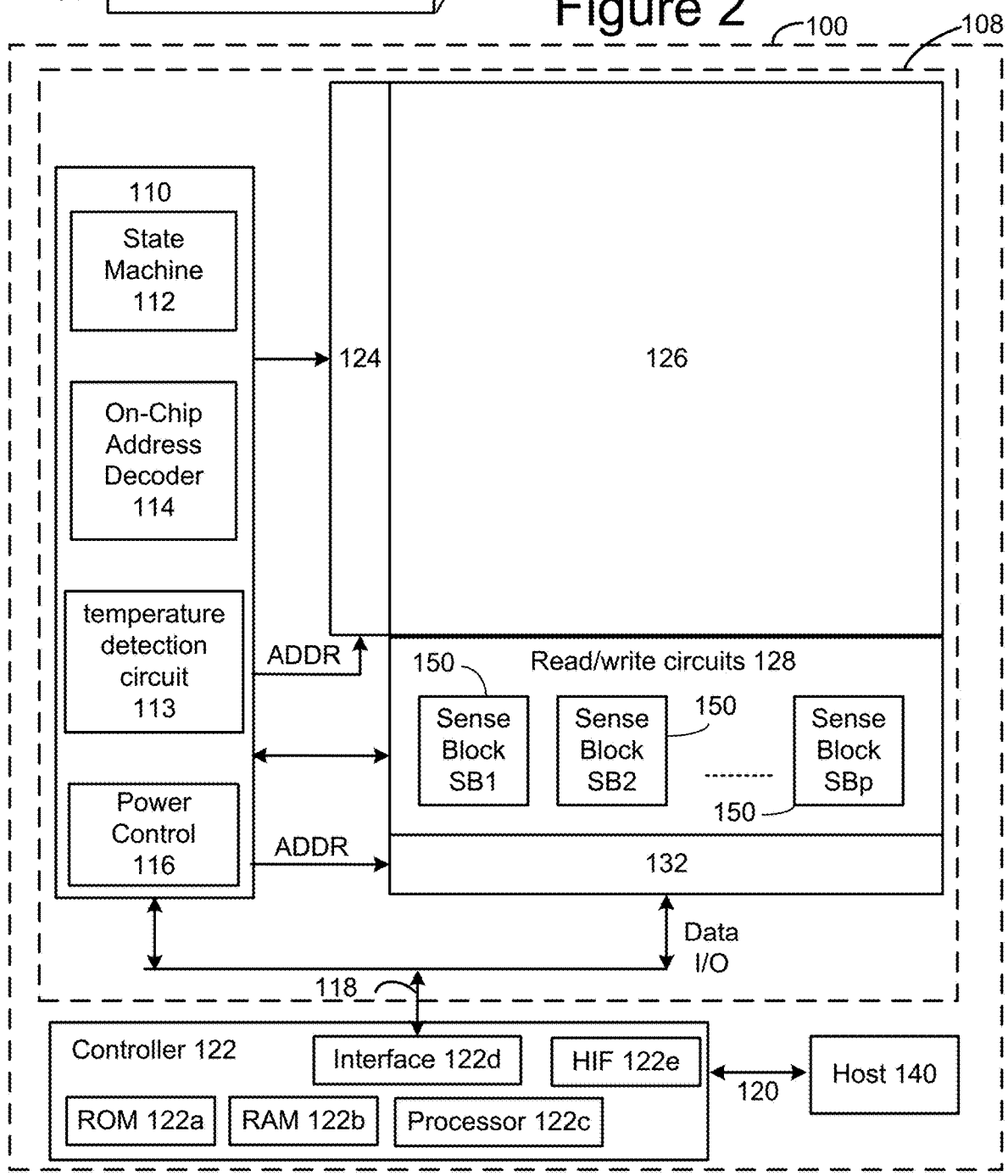
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three-dimensional memory structure 126 of memory cells (such as, for example, a 3D array of memory cells), control circuitry 110, and read/write circuits 128. In other embodiments, a two-dimensional array of memory cells can be used. Memory structure 126 is addressable by word lines via a decoder 124 (row decoder) and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device, such as memory device 100 (e.g., a removable storage card) as the one or more memory die 108. However, in other systems, the Controller can be separated from the memory die 108. In some embodiments, the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three-dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered a circuit or circuits (or a managing circuit) that performs the functions described herein.

Controller 122 (which in one embodiment is an electrical circuit that may be on-chip or off-chip) may comprise one or more processors 122c, ROM 122a, RAM 122b, Memory interface 122d and Host Interface 122e, all of which are interconnected. One or more processors 122C is one example of a control circuit. Other embodiments can use state machines or other custom circuits designed to perform one or more functions. The storage devices (including ROM 122a, RAM 122b) comprises code such as a set of instructions, and the processor 122c is operable to execute the set of instructions to provide the functionality described herein. Alternatively, or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory interface 122d. Host Interface 122e in communication with ROM 122a, RAM 122b and processor 122c, is an electrical circuit that provides an electrical interface between Controller 122 and host 140. For example, Host Interface 122e can change the format or timing of signals, provide a buffer, isolate from surges, latch I/O, etc. Commands and data from host 140 are received by Controller 122 via Host Interface 122e. Data sent to host 140 are transmitted via Host Interface 122e.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array is arranged so that memory cells occupy multiple planes or multiple memory device levels, thereby forming a structure in three dimensions (i.e., in the x, y and z directions, where the z direction is substantially perpendicular, and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in they direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
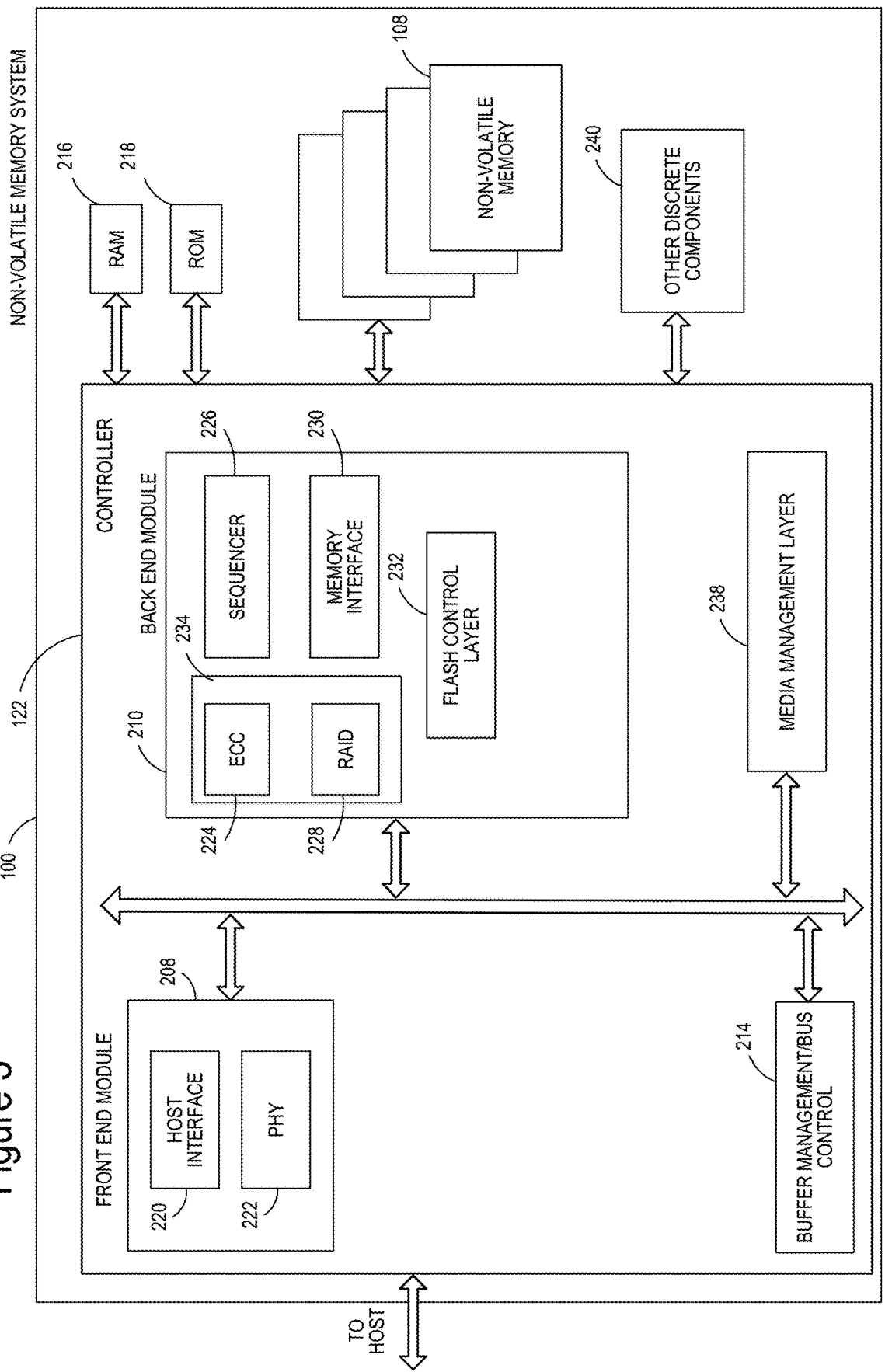
FIG. 3 is a block diagram depicting one embodiment of a Controller.

FIG. 3 is a block diagram of memory system 100, depicting more details of Controller 122. In one embodiment, the system of FIG. 3 is a solid-state drive (SSD). As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed memory cells. Some part of the spare memory cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The communication interface between Controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host, such as in the form of a solid-state disk (SSD) drive installed in a personal computer.

In some embodiments, memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 122 includes a front-end module 208 that interfaces with a host, a back-end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front-end module 208 includes a host interface 220 and a physical layer interface 222 (PHY) that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 may be a communication interface that facilitates transfer for data, control signals, and timing signals.

Back-end module 210 includes an error correction Controller (ECC) engine, ECC engine 224, that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. ECC engine 224 and RAID module 228 both calculate redundant data that can be used to recover when errors occur and may be considered examples of redundancy encoders. Together, ECC engine 224 and RAID module 228 may be considered to form a combined redundancy encoder 234. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of memory system 100 illustrated in FIG. 3 include media management layer 238, which performs wear leveling of memory cells of non-volatile memory die 108. Memory system 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory structure 126 of memory die 108. The MML 238 may be needed because: 1) the flash memory may have limited endurance; 2) the flash memory structure 126 may only be written in multiples of pages; and/or 3) the flash memory structure 126 may not be written unless it is erased as a block (i.e. a block may be considered to be a minimum unit of erase and such a non-volatile memory may be considered a block-erasable non-volatile memory). The MML 238 understands these potential limitations of the flash memory structure 126 which may not be visible to the host. Accordingly, the MML 238 attempts to translate the writes from host into writes into the flash memory structure 126.

Controller 122 may interface with one or more memory die 108. In in one embodiment, Controller 122 and multiple memory dies (together comprising memory system 100) implement a solid-state drive (SSD), which can emulate, replace or be used instead of a hard disk drive inside a host, as a NAS device, etc. Additionally, the SSD need not be made to work as a hard drive.

Figure 4:
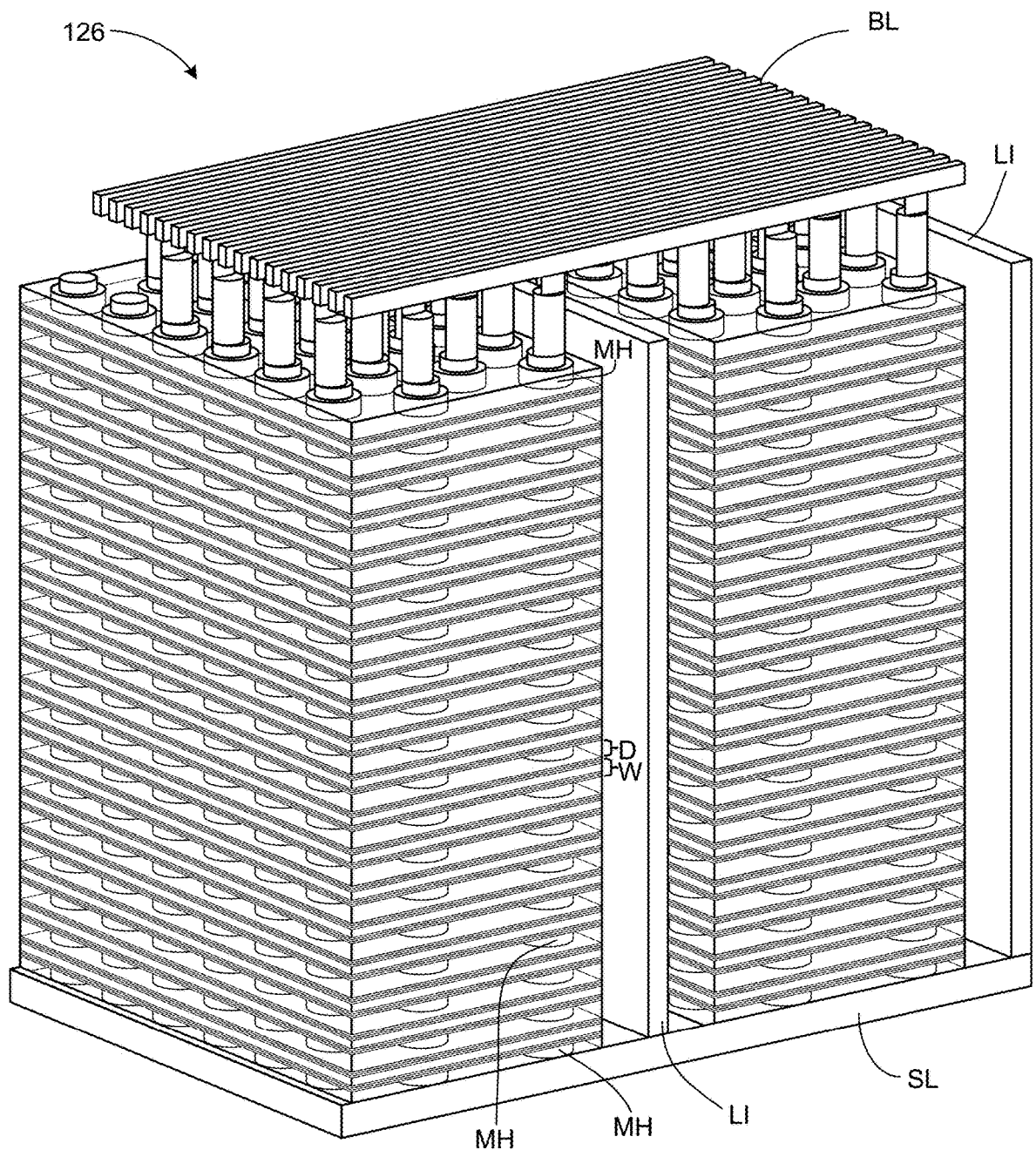
FIG. 4 is a perspective view of a portion of one embodiment of a three-dimensional monolithic memory structure.

FIG. 4 is a perspective view of a portion of a three-dimensional memory structure 126, which includes a plurality memory cells. For example, FIG. 4 shows a portion of one block of memory. The structure depicted includes a set of bit lines BL positioned above a stack of alternating dielectric layers and conductive layers. For example, for illustration purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming a non-volatile storage system, each memory cell lies between a pair of write lines arranged at right angles to each other, parallel to the memory cell, one above and one below the memory cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse but includes a (continuous or non-continuous) vibration or burst of sound, current, voltage light, or other wave.

In some non-volatile storage systems, such as SSDs, memory cards, embedded storage systems, or other systems, multiple non-volatile memory dies may be connected by a memory bus. One or more such memory busses may be connected to common control circuits (e.g. to a non-volatile memory controller). Control circuits may receive commands from a host and in response generate die-specific access requests for individual dies connected to one or more busses.

Die-specific atomic requests may be generated from such access requests and may be sent to corresponding dies via one or more busses. Managing the flow of such requests in an efficient manner can avoid having dies idle and can improve overall performance.

Figure 5:
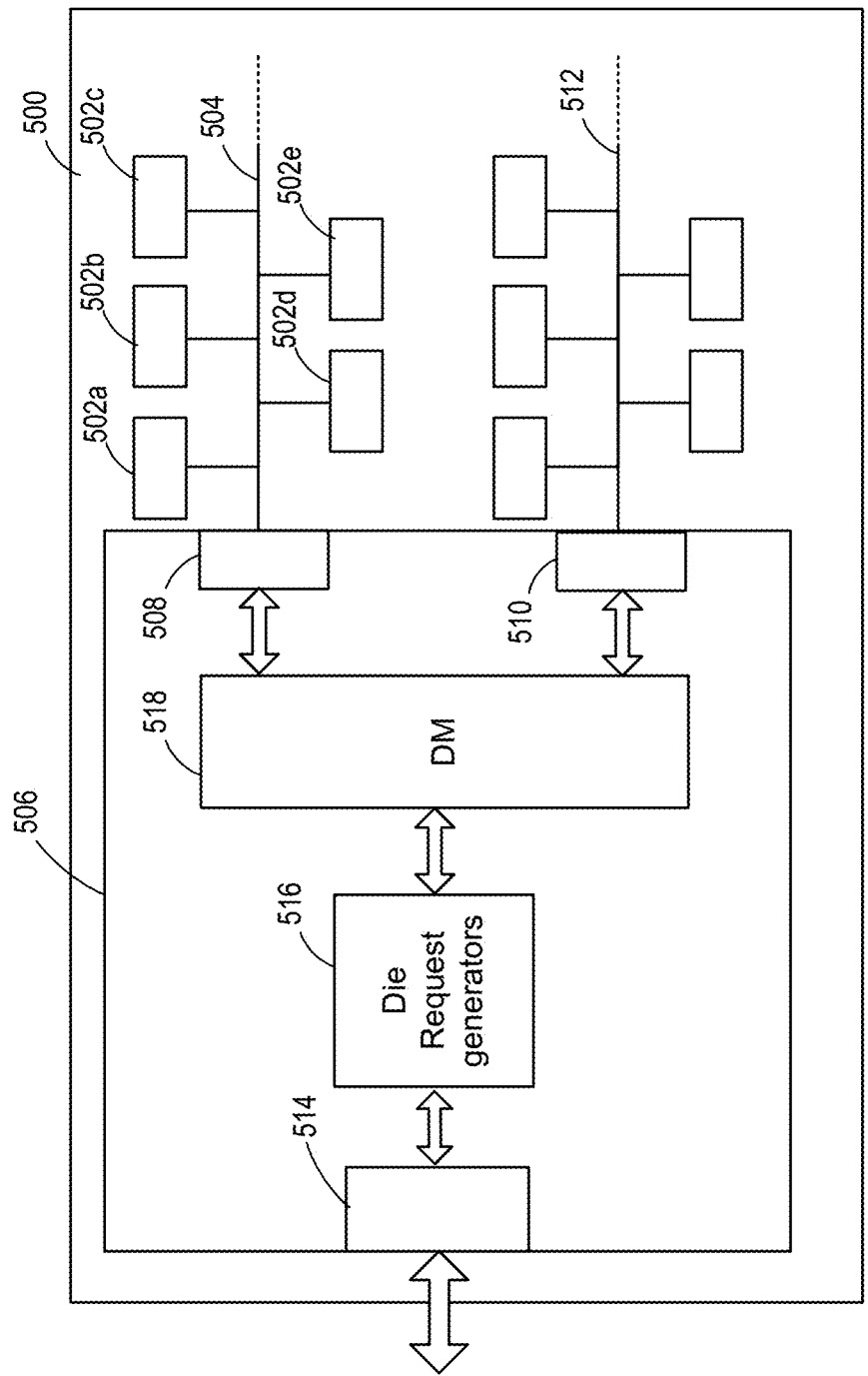
FIG. 5 illustrates an example non-volatile storage system including a plurality of dies.

FIG. 5 illustrates an example of a non-volatile storage system 500 that includes a memory bus 504 coupled to a plurality of non-volatile memory dies 502a-e, with control circuits 506 (e.g. memory control circuit, or memory controller) coupled to non-volatile memory dies 502a-e through memory bus 504. Non-volatile memory dies 502a-e may have a two-dimensional or three-dimensional structure, for example, three-dimensional memory structure 126 of FIG. 4. Control circuits 506 may be in the form of a memory controller such as controller 122 of FIG. 3. FIG. 5 shows a simplified view that includes specific features and it will be understood that control circuits 506 may include any of the features of controller 122 and additional features.

Control circuits 506 include bus interface circuits 508 that directly interface with memory bus 504, e.g. driving appropriate voltages on lines of memory bus 504. Control circuits 506 also include bus interface circuits 510 that interface with memory bus 512, which is coupled to additional non-volatile memory dies. Bus interface circuits 508 and 510 may include one or more processors that are configured by software as bus managers to manage respective busses (i.e. memory bus 504 and memory bus 512). Control circuits 506 may be connected to additional non-volatile memory dies through additional memory busses in some cases and appropriate interface circuits may be provided to interface with such memory busses (including, for example, additional memory controllers). In general, aspects of the present technology are applicable to non-volatile memory dies coupled to control circuits through one or more memory buses (e.g. two memory busses as shown in FIG. 5, or more than two memory busses). Any number of non-volatile memory dies may be coupled to control circuits through such a memory bus, or busses, e.g. 2, 4, 8, 16, 32, 64, etc.

Control circuits 506 include host interface circuits 514 for interfacing with a host system, e.g. with a server, PC, phone, camera, or other electronic device. Host interface circuits 514 may be configured as previously illustrated, e.g. as a host interface 220 and physical layer interface 222 (PHY) of FIG. 3. In general, host commands, including read and write commands, are received from a host by control circuits 506 and in response to control circuits 506 initiate access requests to access corresponding non-volatile memory dies, e.g. non-volatile memory dies 502a-e connected through memory bus 504. Control circuits 506 include die request generators 516, which are circuits configured to generate die-specific access requests in response to host commands (e.g. generate one or more die-specific write requests from a host write command and generate one or more die-specific read requests from a host read command). Die request generators 516 may also generate die-specific access requests in response to input from within control circuits 506, e.g. memory controller operation may require access to data stored in non-volatile memory and may have die request generators 516 generate die-specific access requests accordingly (e.g. to move data during garbage collection or other such operation). Die request generators may break down commands, including host commands, into multiple die-specific access requests, e.g. a single host read command may correspond to many die-specific read access requests at various physical addresses in different dies, and die request generators 516 may generate appropriate die-specific read requests accordingly. For example, a die-specific access request may specify a virtual block address (VBA) of a destination in one of dies 502a-e and may further specify additional information such as the type of access request (e.g. read or write) the length of the operation, the block type (single level cell (SLC), three-level cell (TLC), or other), the request priority, and/or additional information indicated by option flags or otherwise. Additional components may be provided between host interface circuits 514 and die request generators, for example components that perform buffering, logical-to-physical translation, error correction, or other functions.

Die request generators 516 are connected to die manager 518 (DM) so that die-specific access requests pass from die request generators 516 to die manager 518. Die manager 518 manages how such die-specific access requests are handled. Aspects of the present technology are directed to handling die-specific access requests so that non-volatile memory dies are efficiently utilized, and idle time is low. In general, a die manager may include some logic circuits (e.g. one or more processors, which may be separate from processors used for bus interface circuits) and may maintain some information about die status so that such a die manager may make intelligent decisions regarding how die-specific access operations are handled. According to some examples presented below, die specific queues (not shown in FIG. 5) may be provided to allow a die manager to control the flow of die-specific requests separately for each die. The flow of die-specific requests may be separately managed for each non-volatile memory die so that such queues are operated independently and asynchronously, and such management may be event-driven so that die-specific access requests are serviced rapidly as opportunities arise and wait time is reduced or avoided.

Figure 6:
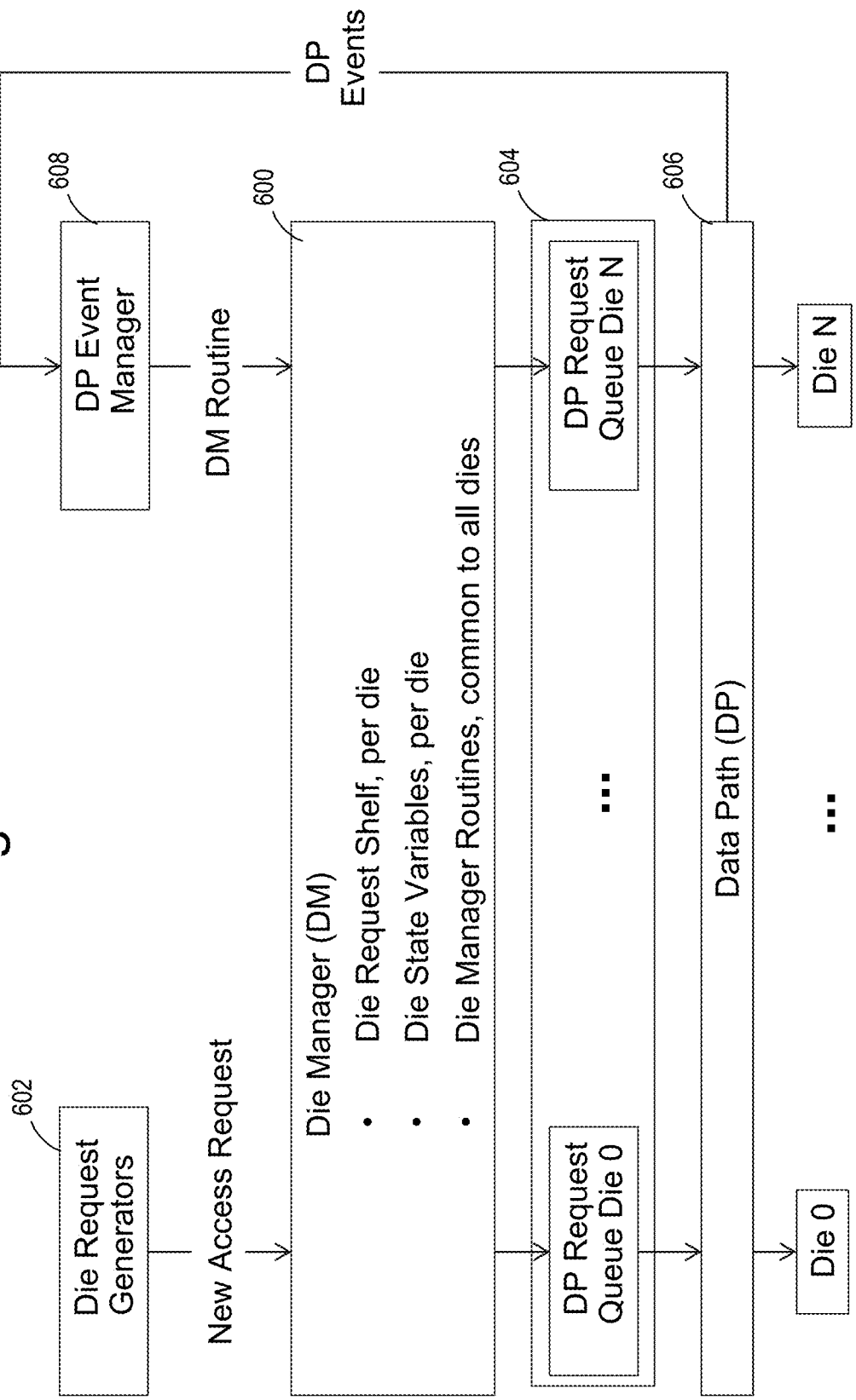
FIG. 6 illustrates an example of a die manager in a non-volatile storage system.

FIG. 6 illustrates an example of a die manager 600 (e.g. die manager 518 in control circuits 506 above). Die request generators 602 provide input to die manager 600, e.g. in the form of die-specific access requests, which may trigger a data manger routine "New Access Request." Die manager 600 generates die-specific atomic requests accordingly, e.g. generating die-specific atomic requests such as a read sense request and a data transfer request in response to a read access request received from die request generators 602. Die-specific atomic requests are added to corresponding data path request queues 604 (e.g. any one of DP Request Queue Die 0 to DP Request Queue Die N), which are die-specific request queues maintained for Die 0 to Die N. A data path 606 extends between data path request queues 604 and corresponding Dies 0 to N. Data path 606 takes die-specific atomic requests from data path request queues 604 and operates on them, e.g. by initiating data transfers to or from corresponding dies or by sending requests to corresponding dies, e.g. Dies 0 to N. Data path 606 may include one or more non-volatile memory buses such as memory bus 504, memory bus 512 and associated bus interface circuits such as bus interface circuits 508, 510, including processors configured as memory bus controllers. Data path 606 may include additional components associated with moving data in a non-volatile memory system, e.g. an internal bus in a memory controller and interface circuits associated with such a bus. Data path 606 may include logic circuits associated with operation of the data path, for example one or more processors configured as one or more bus managers to manage buses and additional logic circuits associated with other components (e.g. each memory bus may have a processor configured as a bus manager). For example, data path 606 may include circuits configured to provide signals to die manager 600 to indicate when a data path event has occurred. Thus, processors of data path 606 may provide signals to one or more processors of die manager 600.

FIG. 6 shows data path Event Manager 608 (DP Event Manager) coupled to data path 606 to monitor data path events and to initiate data manager routines, e.g. providing an input to die manager 600 indicating that die manager 600 should start a particular routine, which may add die-specific atomic requests to data path request queues 604. In general, data path 606 operates on die-specific atomic requests in a given data path request queue in order (i.e. there is no reordering of die-specific atomic requests in a data path request queue).

Die Manager 600 has several features to facilitate efficient flow of die-specific atomic requests to data path request queues 604 so that data path 606 can act on them and ensure that dies 0 to N remain busy. Die manager 600 includes a die request shelf (another set of die-specific queues), which allows die access requests from die request generators to be shelved, or queued, on a die-specific basis. Die manager 600 also maintains die state variables on a die-specific basis, where die state variables indicate information about the current state of their respective dies that facilitates determining how die-specific atomic requests should be added to their respective data path request queues. Die manager 600 operates using die manager routines that are commonly applied to all dies, with a die manager routine being called for a specific die independently of any other die (i.e. the same routine may be called for any one specific die of die 0 to N and executes accordingly on queues associated with the specific die independently of any other die). Such a routine may access die state variables for the specific die and may add die-specific atomic requests to a corresponding die-specific request queue and then close without regard to any other dies and thus without delays that might occur due to coordinating between dies. Die manager routines are generally configured to perform simple die-specific functions rapidly, without significant waiting periods (e.g. without polling or waiting for some response), and die manager routines are generally only initiated in response to a triggering event that indicates that an opportunity exists for a die manger routine to add die-specific atomic requests to a data path request queue. Thus, die manager routines facilitate efficient feeding of die-specific atomic requests to data path request queues 604 and generally avoid waiting periods that might affect performance.

Figure 7:
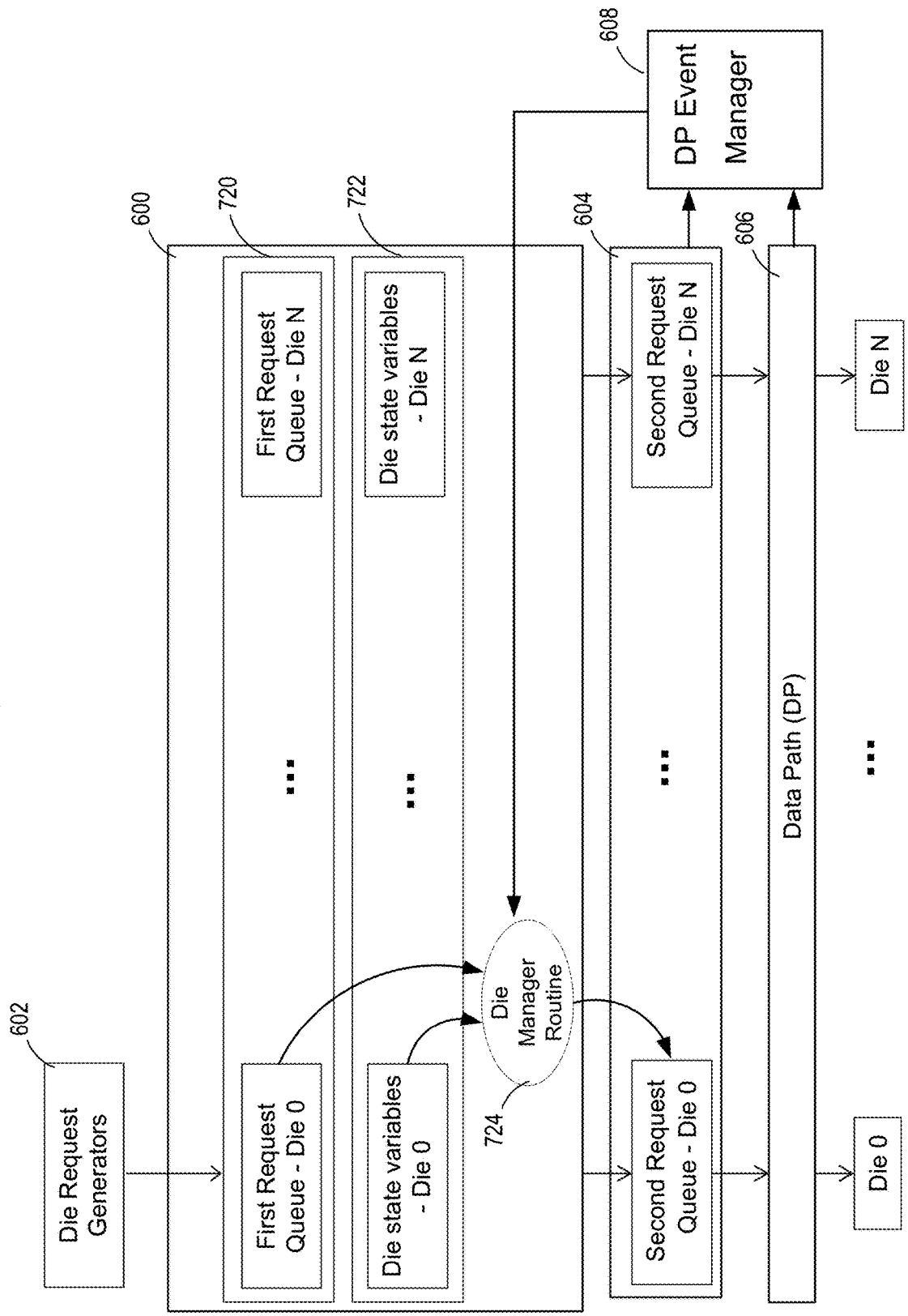
FIG. 7 illustrates an example of a die manager routine in a die manager.

FIG. 7 illustrates some features and aspects of operation of die manager 600 of FIG. 6 and its interactions with data path request queues 604. FIG. 7 shows die request shelf 720, which includes a plurality of first request queues, which are die-specific request queues for dies 0 to N, e.g. First Request Queue—Die 0 corresponds to Die 0 and is dedicated to holding die-specific access requests from die request generators 602 that are directed to Die 0. Die state variables 722 includes a plurality of die state variables that are maintained on a die-specific basis, e.g. in a plurality of die-specific state variable registers to indicate die-specific conditions. Thus, Die state variables—Die 0 in die state variables 722 are stored in die-specific state variable registers that are dedicated to storing information relating to Die 0. Data path request queues 604 are coupled to data path 606 so that data path 606 takes die-specific atomic requests from respective request queues in data path request queues 604 to send to respective dies 0 to N. Individual data path request queues of data path request queues 604 are labeled as "Second Request Queue(s)" to distinguish them from "First Request Queue(s)" of die request shelf 720.

In contrast to first request queues, which contain die access requests from one or more request generators, second request queues contain atomic requests obtained from die access requests of a corresponding first request queue. Thus, Second Request Queue—Die 0 contains atomic requests obtained from one or more access requests of First Request Queue—Die 0 and Second Request Queue—Die N contains atomic requests obtained from die access requests of First Request Queue—Die N (and similar correspondence applies to request queues 1 to N-1). More than one atomic request may be generated and added to a second request queue from an access request in a corresponding first request queue.

Die manager routine 724 executes as a die-specific routine that adds die-specific atomic requests to Second Request Queue—Die 0 of the plurality of die-specific data path request queues 604, where the atomic requests are generated from die access requests in First Request Queue—Die 0. Thus, die manager routine 724 manages the flow of die-specific requests for die 0 to data path 606. Die manager routine 724 is initiated in response to a die-specific triggering events, for example, addition of a new access request to First Request Queue—Die 0 or a triggering event indicated by data path event manager 608. Die manager routine 724 is only initiated for a specific die in response to a die-specific triggering event so that die-specific queues are operated independently and asynchronously, thereby allowing dies to operate efficiently, without regard to other dies. In the absence of a triggering event for a given die, die manager routine 724 is not initiated for that die and does not operate on the corresponding queues. In some cases, die manager routines may be enabled or disabled by a die manager to avoid initiating die manager routines unnecessarily, for example, by a bit mask that indicates the status of different die manager routines as "enabled" or "disabled."

Triggering events that cause die manager 600 to initiate die manager routines may occur in data path 606 and data path request queues 604, where such triggering events generally indicate some opportunity to add one or more die-specific atomic request to a corresponding second request queue. Data path event manager 608 is coupled to data path 606 and data path request queues 604 to detect triggering events and to inform die manager 600 about the triggering event (e.g. which die, and what event occurred) so that a corresponding die manager routine may be initiated. Different die manager routines may be initiated according to different triggering event. While die manager routine 724 is shown acting on request queues of Die 0, it will be understood that die manager routines may be initiated for request queues of any die (i.e. Die 0 to Die N). A data path event manager may be considered a part of a data path manager (e.g. data path event manager 608 may be considered part of a data path manager of data path 606).

Figure 8:
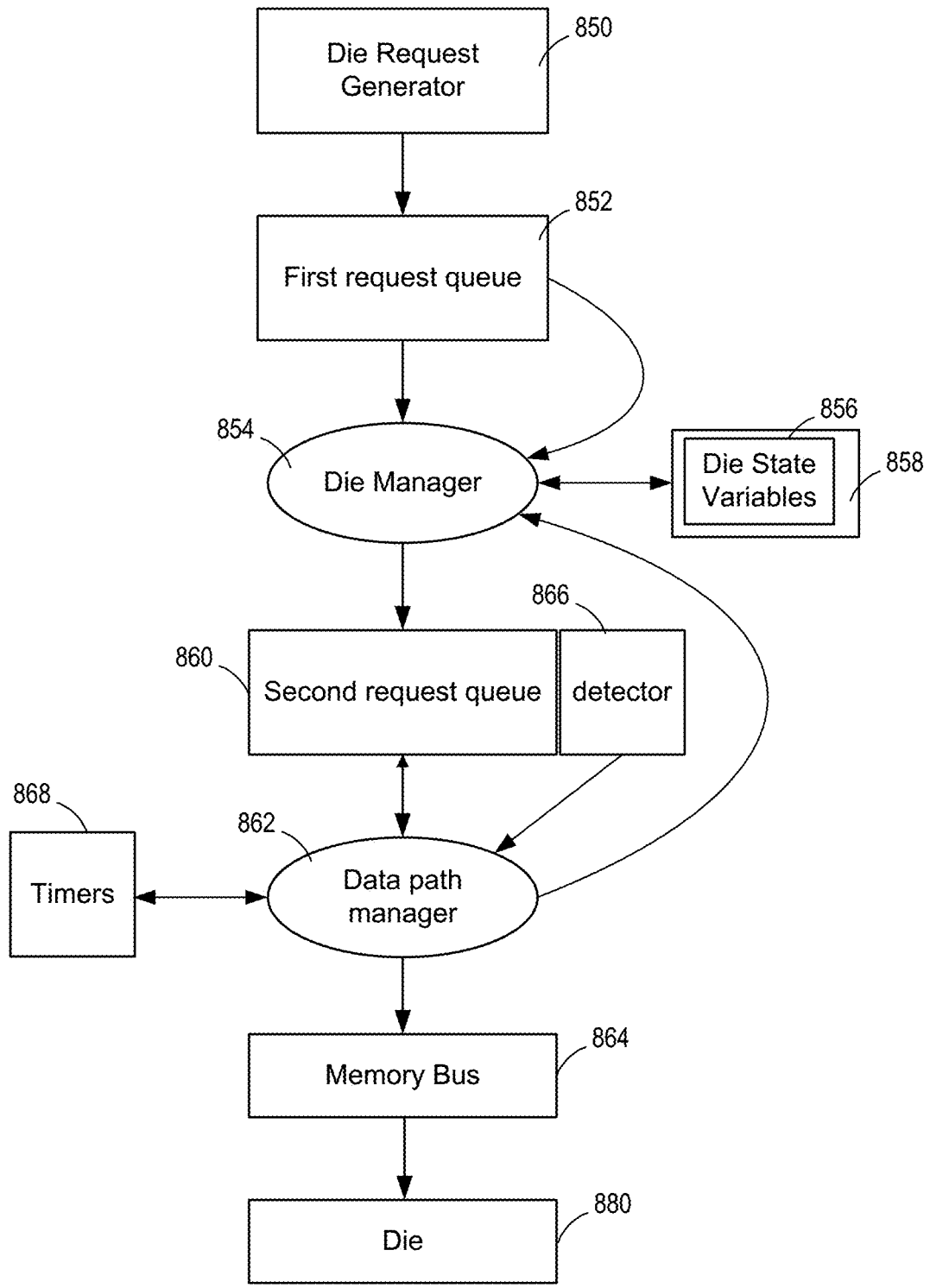
FIG. 8 illustrates an example of operation of a die manager.

FIG. 8 shows an example that illustrates some aspects of a die manager including triggering events that may cause a die manager to initiate a die manager routine. A die request generator 850 generates a die-specific access request for Die 880 that is sent to the corresponding first request queue, first request queue 852 (i.e. First request queue 852 is a die-specific request queue corresponding to Die 880). The receipt of a new die-specific access request is a triggering event that causes Die Manager 854 to initiate a die manager routine. A die manager may check to ensure that a corresponding die manager routine is enabled prior to initiating it (e.g. a die manager routine may be disabled for some reason, e.g. because of some prior routine). A die manager routine of die manager 854 may check die state variables 856 stored in registers 858 in order to determine the current state of Die 880 and proceed accordingly. Die state variables 856 stored in registers 858 may be updated by Die manager 854 according to any action taken. Registers storing die state variables (e.g. registers 858 storing die state variables 856) may be considered a means for storing die-specific state information (where the die-specific atomic requests are added to the plurality of die-specific request queues according to die-specific state information relating to corresponding dies). In some examples, a die manager routine of die manager 854 generates die-specific atomic requests in Second request queue 860 from a die-specific access request in First request queue 852. Data path manager 862 may then operate on such die-specific access requests, e.g. by sending die-specific atomic requests via memory bus 864 to die 880. Die manager 854 may be considered a means for generating die-specific atomic requests from die-specific access requests and adding die-specific atomic requests to a plurality of die-specific request queues in response to indicators of triggering events.

Data path manager 862 may also detect triggering events and may communicate such events to die manager 854, which may initiate die manager routines accordingly. Data path manager 862 may include a data path event manager such as data path event manager 608 that is dedicated to detecting such events and informing die manager 854 about such events (a data path event manager is not shown separately in FIG. 8). Data path manager 862 may also include a bus manager that operates memory bus 864 and other components associated with other elements of a data path (e.g. other bus managers that manage other busses).

Second request queue 860 has a detector 866 that is configured to detect entries in second request queue 860 and to provide an indicator to data path manager 862 accordingly. For example, detector 866 may indicate when the number of entries in second request queue drops below a threshold number. This may be a triggering event that results in an indicator being sent to die manager 854, which calls a corresponding die manager routine. Second request queue 860 and detector 866 may be implemented in combined hardware so that no separate software routine is required to check the number of entries in second request queue 860. Detector 866 and similar detectors coupled to other second request queues may be considered an example of a means for monitoring a plurality of die-specific request queues for triggering events and generating indicators of triggering events.

Data path manager 862 is coupled to one or more timers 868, which allow data path manager 862 to set a timer when it performs certain functions and to react to expiration of such timers. For example, a timer may be set when certain data is transferred to die 880 via memory bus 864 and when the timer expires, this may be a triggering event that calls die manager 854 to call a die manager routine for die 880.

Figure 9:
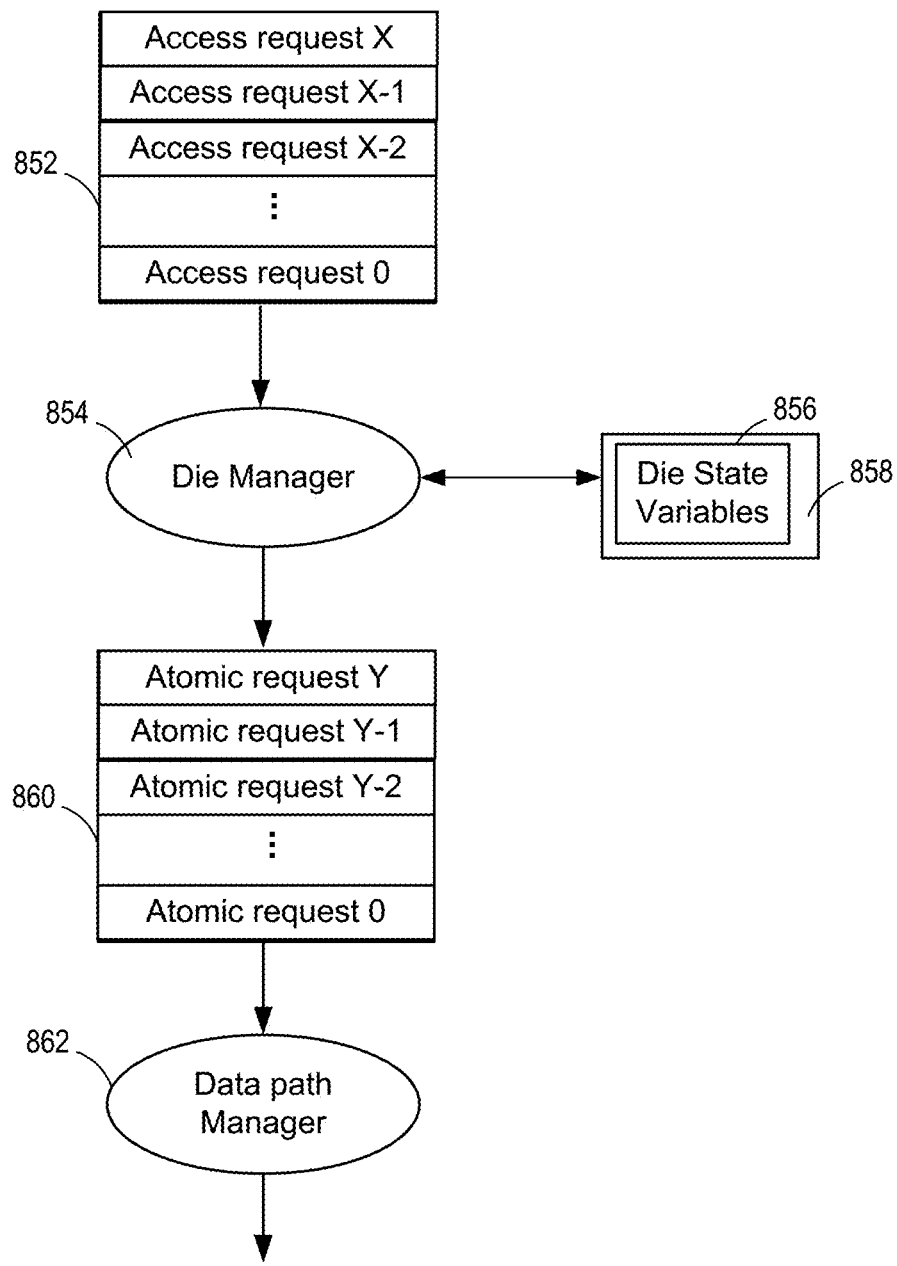
FIG. 9 illustrates an example of a die manager between first and second die-specific request queues.

FIG. 9 illustrates entries in first request queue 852 and second request queue 860 of FIG. 8. Requests move down in the example illustrated, from first request queue 852, via die manager 854 (according to die state variables 856 stored in registers 858), to second request queue 860. Data path manager 862 takes die-specific atomic requests from second request queue 860 and operates on them in order. FIG. 9 shows X+1 entries (Access request 0 to Access request X) in first request queue 852 and shows Y+1 entries (Atomic request 0 to Atomic request Y) in second request queue 860. The numbers of entries may not be equal (e.g. X and Y may, or may not, be the same) and while the entries in both queues are die-specific requests directed to the same die, entries in second request queue 860 are atomic requests while requests in first request queue 852 are not atomic and may be broken down into atomic requests by die manager 854.

Figure 10:
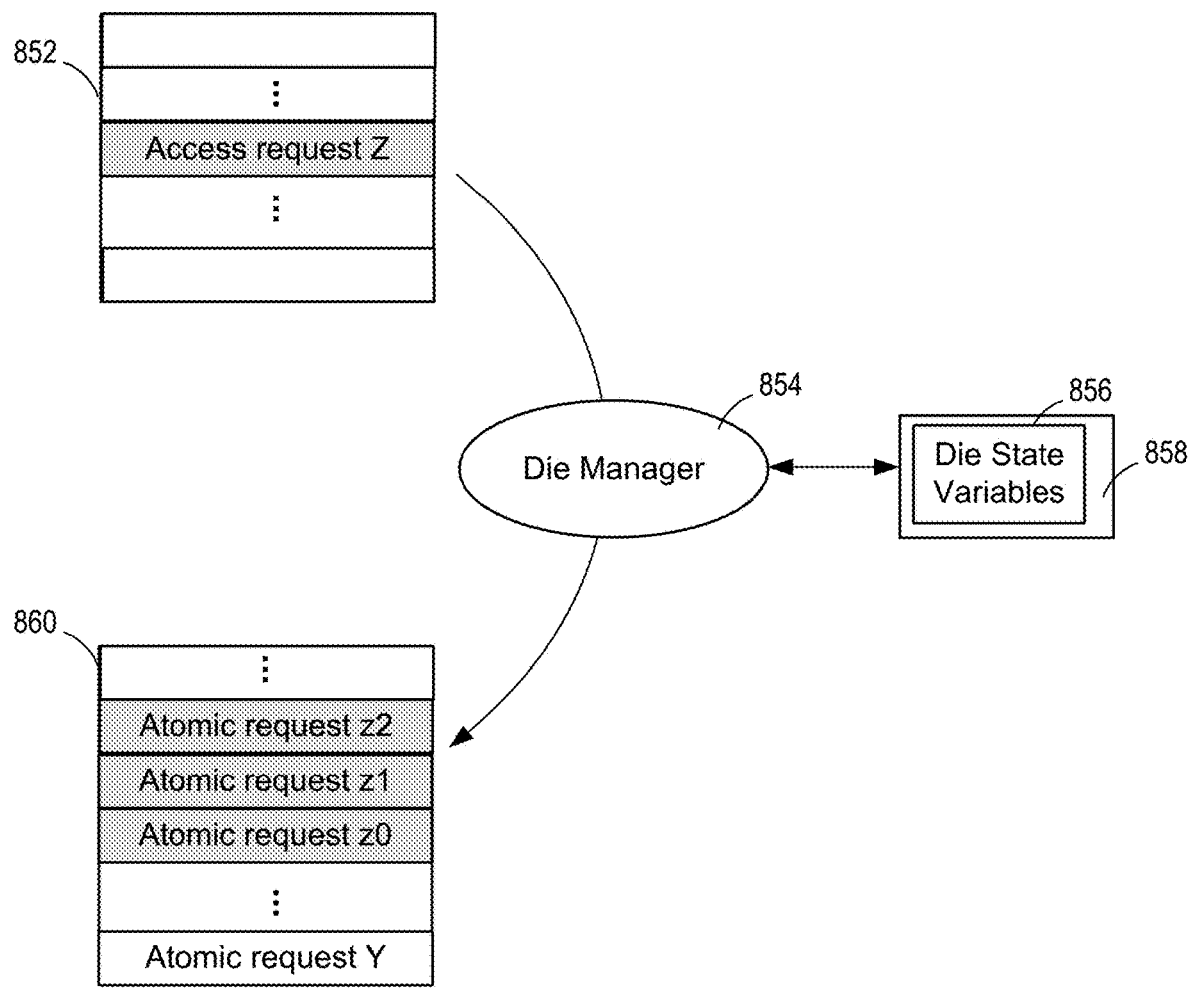
FIG. 10 illustrates an example of generation of die-specific atomic requests in a second request queue from a die-specific access request in a first request queue.

FIG. 10 illustrates how die manager 854 may generate multiple die-specific atomic requests from a die-specific access request in first request queue 852 and may add the die-specific atomic requests to second request queue 860. In response to a triggering event (which may be a change in second request queue 860 as one or more entries are acted on by a data path manager) die manager 854 calls an appropriate die manger routine. The die manager routine checks the entries in first request queue 852, reads die state variables 856 in registers 858, and proceeds accordingly. In the example shown, die manager 854 operates on Access request Z in first request queue 852 and generates a plurality of atomic requests (Atomic request z0 to z2) in second request queue 860 from Access request Z. For example, where an access request is a write request, a die manager may generate atomic requests including: a data transfer request, a program request, and a check program status request. Where an access request is a read request, a die manager may generate atomic requests including: a read sense request and a data transfer request.

In order to ensure efficiency, die manager 854 adds atomic requests to second request queue 860 opportunistically by calling die manager routines in response to triggering events. When such atomic requests are added to a second request queue they may be added in the order indicated by the first request queue or may be reordered. Thus, for example Atomic request z0 to z2 are shown in order in second request queue 860 and other atomic requests may be similarly added in the same order as in first request queue. This means that Atomic requests z0 to z2 are acted on in order (atomic requests in second request queue 860 are acted on in the order in which they are added to second request queue 860 by die manager 854 so that Atomic request Y is the next request to be operated on by the data path manager). However, atomic requests may not always be added to a second request queue in the order indicated by the order of access requests in a first request queue.

Figure 11:
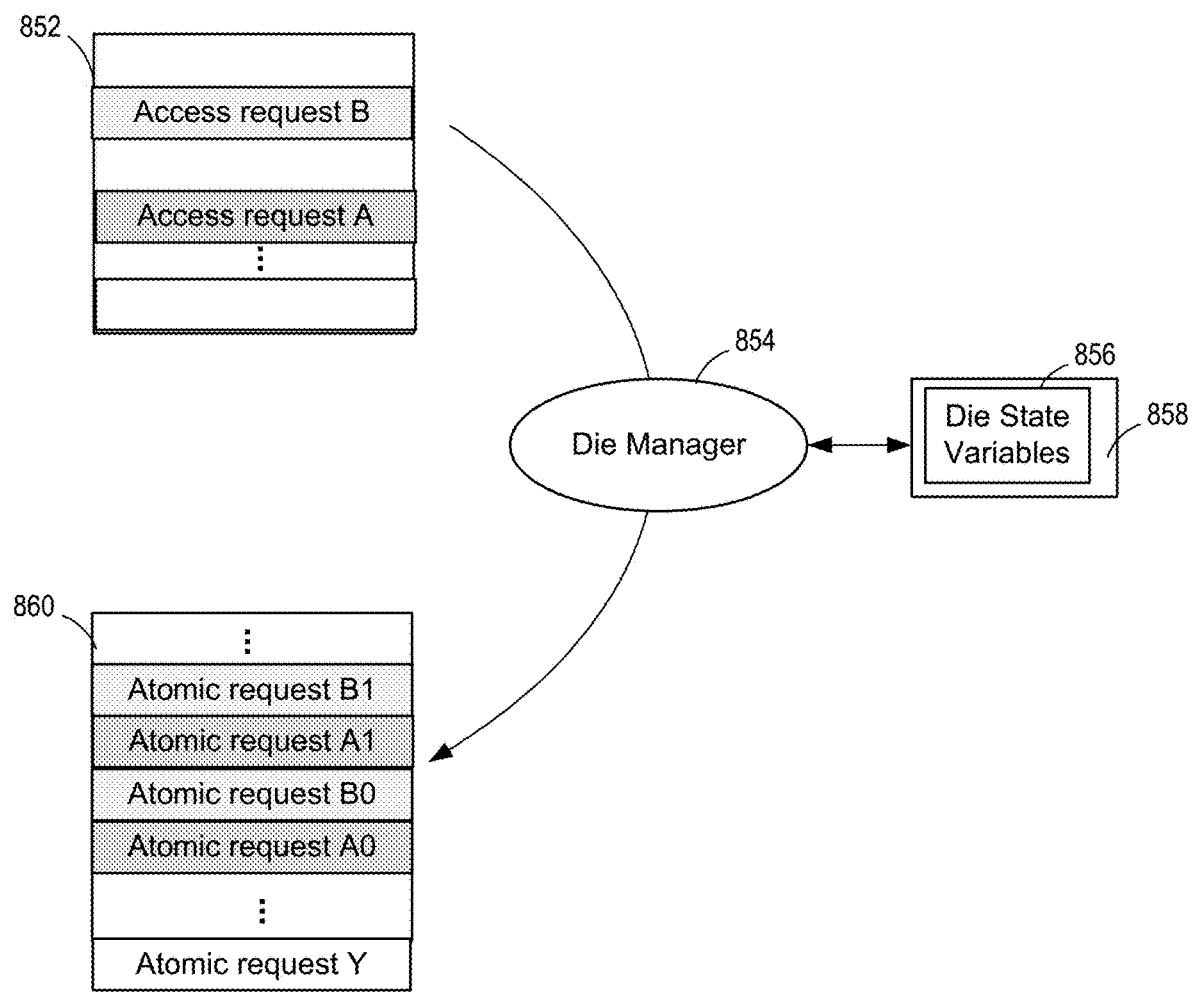
FIG. 11 illustrates an example of reordering of die-specific atomic requests.

FIG. 11 shows another example in which two access requests, Access request A and Access request B, are in first request queue 852 and are operated on by die manager 854 in response to a triggering event. In this case, die manager 854 reorders the atomic requests it generates prior to adding the atomic requests to second request queue 860, from which they are taken and acted on in the order of second request queue 860. Thus, atomic requests A0 and A1 generated from Access request A are interleaved with atomic requests B0 and B1 generated from Access request B. For example, where Access requests A and B are read requests, Atomic requests A0 and B0 may be read sense requests that are directed to different pages and Atomic requests A1 and B1 may be corresponding read transfer requests. Where die state variables 856 indicate that read caching is enabled, reordering atomic requests in the manner shown may allow a read sense request associated with Atomic request B0 to be sent prior to a data transfer request of Atomic request A1 (requests are operated on from the bottom up, i.e. A0, then B0, A1, B1). Thus, sensing associated with Atomic request B0 may be performed in parallel with transfer of data in response to Atomic request A1. A determination whether to apply such a reordering of atomic requests prior to adding atomic requests to second request queue 860 may be made according to die state variables 856, which may include registers for read cache enable status, write cache enable status (e.g. interleave read sense and data transfer requests may be reordered as shown in FIG. 11 based on a read cache enable status=enabled, or interleaving data transfer and data program requests may be reordered based on write cache enable status=enabled). Access requests in first request queue 852 may have associated priority indicators that allow them to be taken out of order (i.e. not in the order in which they were added to first request queue 852). In contrast, atomic requests in second request queue 860 may be taken in order so that any reordering may be done prior to adding atomic requests to second request queue 860.

In some cases, a die manager such as die manager 854 may make additional changes to die-specific atomic requests prior to adding them to a second request queue such as second request queue 860. For example, in some cases, a die manager may recognize that two read access requests are directed to the same physical page in a non-volatile memory. In this case, it is unnecessary to sense the data twice as the data is sensed and loaded into latches by a first atomic read sense request. Thus, a die manager may omit adding a second read sense request directed to the same physical page to a second request queue in order to avoid reading the same data twice in what may be referred to as a "sense avoidance read." Sense avoidance reads may be enabled by a corresponding bit in die state variables, e.g. die state variables 856. A die manager may monitor read addresses to identify such repeated write access requests and modify its response accordingly, e.g. generating one read sense request instead of two for sequential read requests directed to the same physical page.

A die manager may initiate various die manager routines in response to various triggering events. Occurrence of such triggering events generally indicates some potential opportunity to add one or more atomic requests to a corresponding data path request queue (second request queue). Such opportunities may arise, for example, as a result of a change in a second request queue or receipt of a new access request from a request generator. Some examples of such triggering events and die manager routines initiated in response to triggering events are described below.

Figure 12:
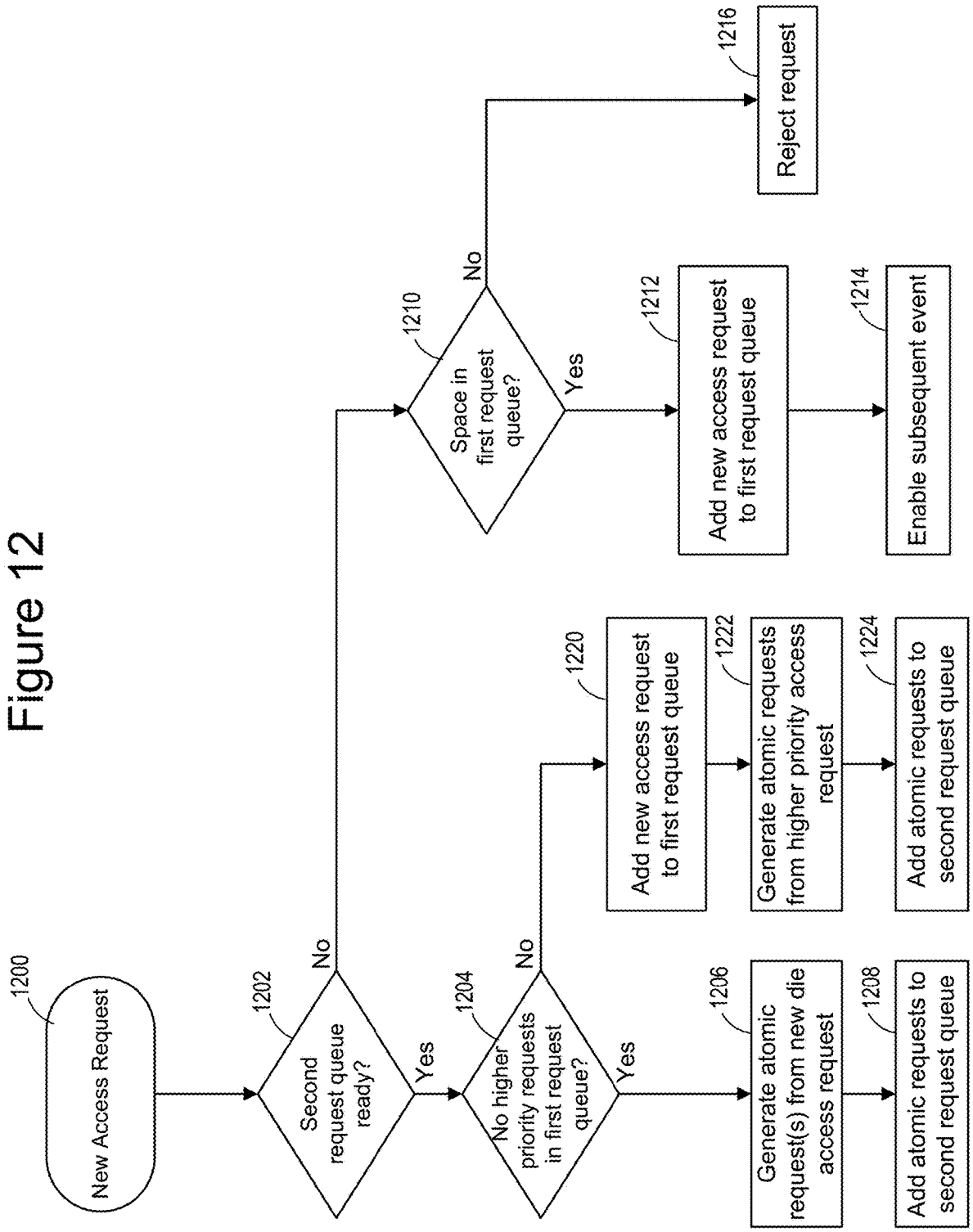
FIG. 12 illustrates an example of a die manager routine triggered by a new access request.

FIG. 12 illustrates an example of operation of a die manager routine that is initiated for a corresponding die in response to receipt of a new access request 1200 by a die manager (e.g. die manager 600 receiving a new die-specific access request from die request generators 602 and initiating the die manager routine of FIG. 12 in response). A determination 1202 is made as to whether the corresponding second request queue (data path request queue) is ready, i.e. whether it is in a state to receive more entries, or if it is full or otherwise unavailable. If the second request queue is ready, then the first request queue is checked for any higher priority requests in the first request queue 1204. If there are no higher priority requests in the first request queue 1204 then atomic request(s) is/are generated from the new die access request 1206 and these atomic requests are added to the second request queue 1208.

Where the second request queue is not ready (determination 1202) then a determination 1210 is made as to whether there is space in the first request queue 1210. If there is space in the first request queue 1210 then the new access request is added 1212 to the first request queue. In this case, a data path event is left enabled 1214 (e.g. by setting a corresponding bit in a bit mask) so that a subsequent die manager routine can be called when there is sufficient space in the second queue (e.g. see example of FIG. 13 below). In general, any die manager routine may configure one or more such enable bits to enable or disable subsequent die manager routines directed to the same die (the die manager routine of FIG. 12, which responds to a new access request may be left permanently enabled). If there is no space in first request queue 1210 then the new access request is rejected 1216. The die request generator that submitted the new access request may subsequently resubmit the request.

Where a higher priority request is present in the first request queue 1204, the new access request is added to the first request queue 1220. Atomic requests are generated from the higher priority access request 1222 and the atomic requests are added to the second request queue (i.e. the higher priority access request is acted on first and the new access request is buffered in the first request queue).

In addition to initiating a die manager routine in response to a new access request as shown in FIG. 12, different die manager routines may be initiated in response to triggering events occurring in a second request queue or data path (data path events). Some examples are described below. It will be understood that other triggering events may also be used and that triggering events may be configured according to requirements.

Figure 13:
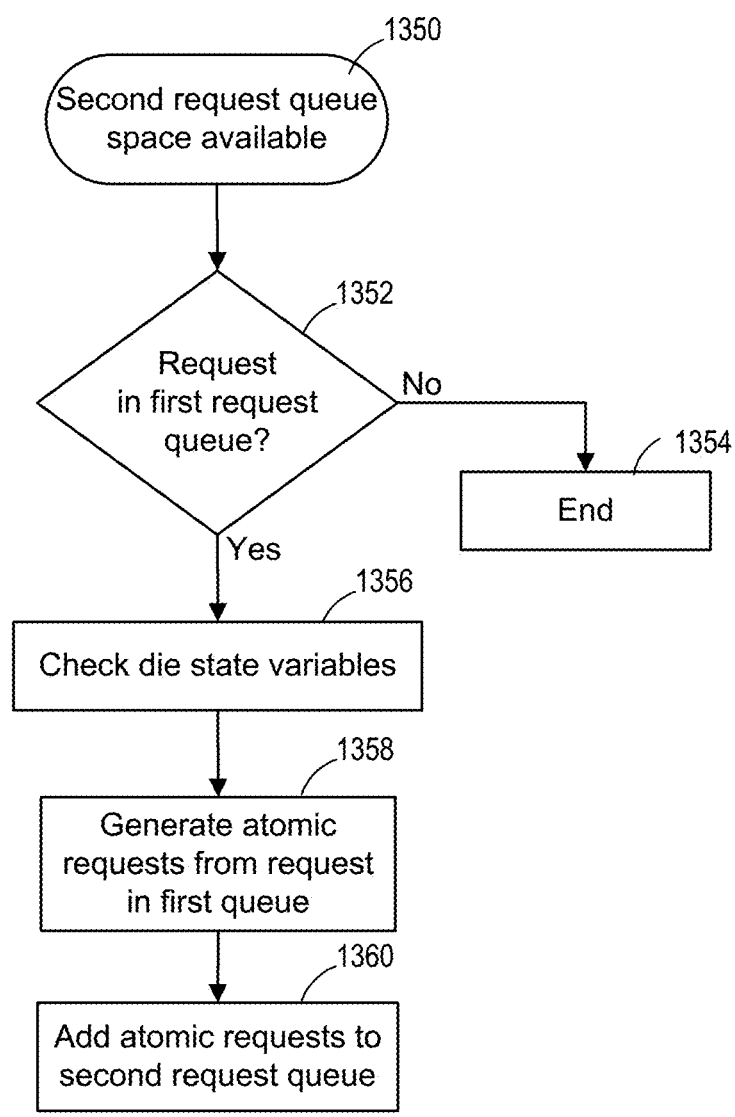
FIG. 13 illustrates an example of a die manager routine triggered by space available in a second request queue.

FIG. 13 shows an example of operation of a die manager routine (e.g. a die manager routine in die manager 854 of FIG. 8) initiated in response to a determination that space is available in a second request queue (e.g. second request queue 860). Thus, detection that space is available in a second request queue, or more than a threshold amount of space is available in a second request queue, may be considered a triggering event. In some cases, a second request queue may become full or filled above some limit (e.g. more than some threshold number of entries) so that a die manager may be unable to add atomic requests. Subsequently, when space becomes available, this may be a triggering event because a new opportunity exists for a die manager to send new atomic requests. For example, a die manager routine initiated by die manager 854 in response to a determination by detector 866 that entries in second request queue 860 have dropped below a threshold. Such a detector may detect a triggering event in a second request queue (e.g. based on a number of entries in the second request queue). A detector may be reconfigured as needed. For example, the amount of available space that generates a triggering event may be configured and adjusted. When space is available in a second request queue 1350, a determination 1352 is made as to whether there is a request in the corresponding first request queue (e.g. if space is available in second request queue 860, a determination is made as to whether there are any entries in first request queue 852). If there are no access requests in the first request queue, then this die manager routine ends 1354 since there is no source of requests available to add to the second request queue. In some cases, a die manager routine enable bit corresponding to the die manager routine of FIG. 13 may be set to "disable" when there are no requests in the first request queue so that the die manager routine of FIG. 13 is not initiated unnecessarily. If there is a request in the first request queue (determination 1352) then the die state variables are checked 1356 (e.g. to check if caching is enabled, what was the last request acted on, etc.). Atomic requests are generated from the request in the first queue 1358 and are added to the second request queue 1360 according to the die state variables, e.g. reordering or otherwise configuring atomic requests according to die state variables.

Figure 14:
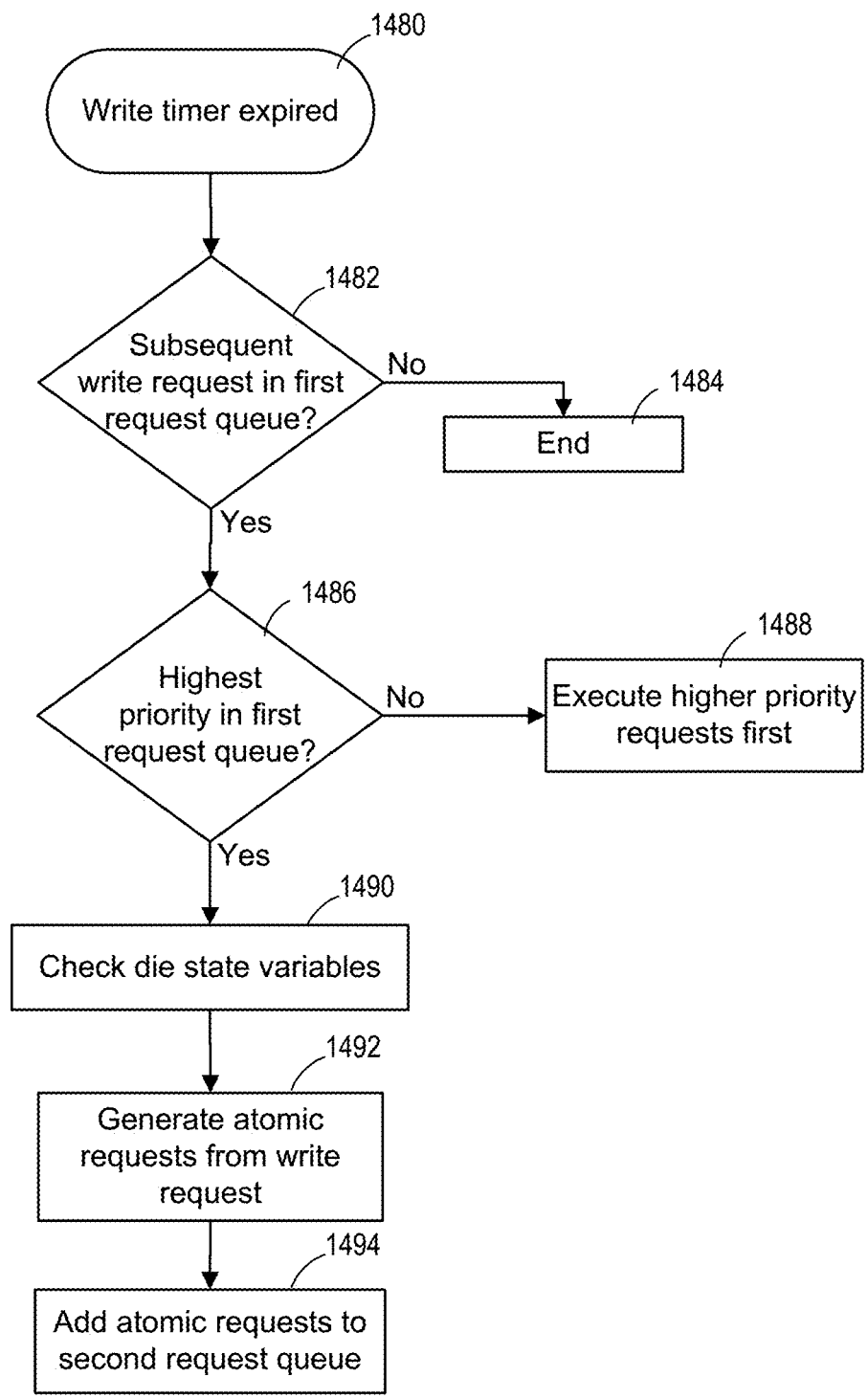
FIG. 14 illustrates an example of a die manager routine triggered by expiration of a write timer.

FIG. 14 shows an example of operation of a die manager routine (e.g. a die manager routine in die manager 854 of FIG. 8) initiated in response to expiration of a write timer. Thus, expiration of a write timer may be considered a triggering event. For example, timers 868 of FIG. 8 may be set by data path manager 862 for various purposes. In an example where write caching is enabled, a timer may be set when a data transfer occurs. Subsequent transfer requests are blocked by the die manager while the timer runs in order to allow for a read to occur between writes, i.e. a subsequent transfer could occupy the cache and prevent it from being used for a read, so such a transfer may be delayed by the timer for a predetermined period. The die manager may add a read sense request to the individual second request queue while the timer is running, i.e. subsequent to initiating the timer and prior to expiration of the timer. Such a timer may be set to expire before previously transferred data is fully written so that transfer occurs in parallel with writing, shortly before writing finishes, thus maintaining a window for a read operation through much of the write (in what may be referred to as a "suspend/resume read"). When such a timer expires, there is a potential opportunity for adding more atomic write requests to the second request queue. Accordingly, when the write timer expires 1480, a determination 1482 is made as to whether there is a subsequent write request in the first request queue and whether it is the highest priority request in the first request queue 1486. If a subsequent write request is not in the first request queue (determination 1482) then the die manager routine ends 1484 and if there are higher priority requests in the first request queue, then they are executed first 1488. If the subsequent write request is the highest priority request in the first request queue 1486 then the state variables are checked 1490, atomic requests are generated from the write request 1492, and the atomic requests are added to the second request queue 1494.

Figure 15:
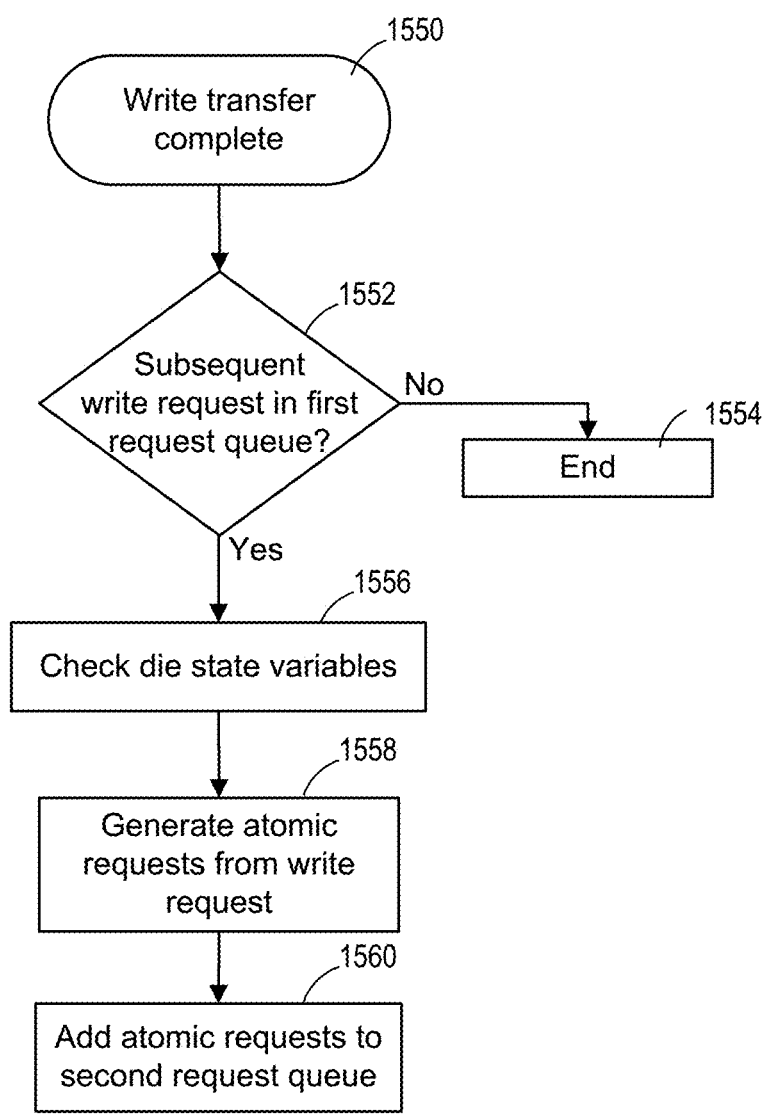
FIG. 15 illustrates an example of a die manager routine triggered by completion of a write transfer.

FIG. 15 shows an example of operation of a die manger routine (e.g. die manager routine in die manager 854 of FIG. 8) initiated in response to completion of a write transfer to a corresponding non-volatile memory die. Thus, completion of a write transfer to a corresponding non-volatile memory die may be considered a triggering event. For example, in TLC memory, completion of a write transfer for a lower or middle page of a cached write may be used as a triggering event to initiate a die manager routine such as shown in FIG. 15, which can add subsequent write transfer requests to the second request queue. Like the example of FIG. 14, this may allow a die manger to hold off sending subsequent write transfer requests for a period of time to facilitate suspend/resume reads. When a data path manger such as data path manager 862 indicates that a write transfer is complete 1550 (e.g. corresponding write transfer request has been taken from second request queue 860 and has been acted on) a determination is made as to whether a subsequent write request is in the first request queue 1552. If the subsequent write request is not in the first request queue 1552 then the die manager routine ends 1554. If the subsequent write request is in the first request queue then the state variables are checked 1556, atomic requests are generated from the write request 1558, and the atomic requests are added to the second request queue 1560.

Figure 16:
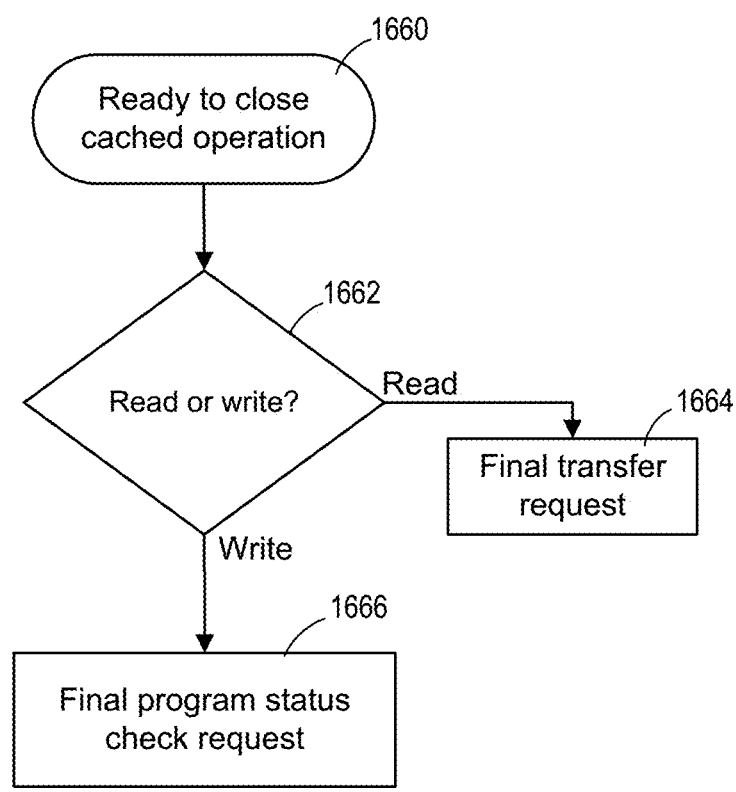
FIG. 16 illustrates an example of a die manager routine triggered by completion of a last cache operation.

FIG. 16 shows an example of operation of a die manager routine (e.g. die manager routine in die manager 854 of FIG. 8) initiated in response to completion of a last cache operation of a series of cache operations, for example, as indicated by a true ready indicator from a corresponding die. Thus, completion of a last cache operation of a plurality of cache operations may be considered a triggering event. In general, caching (e.g. read caching or write caching) may be used to efficiently manage memory access, for example, sequential reads and writes (e.g. as illustrated in FIG. 11). As long as a steady stream of read or write requests is received, a read or write cache process can be extended indefinitely. Eventually the flow of access requests will stop, and the corresponding die will complete the last operation that was requested. The die at this point is still in an incomplete cache state and should be properly closed. For example, for cached reads, a final transfer request may be needed to initiate transfer of data from cache and for cached writes a final program status check may be needed. The data path manager (e.g. data path manager 862 of FIG. 8) may inform the die manager (e.g. die manager 854) when the corresponding die reaches the True Ready state (i.e. the die has completed the last cached operation) and there are no additional cache operations in the second request queue. This triggering event, may cause the die manager to initiate a corresponding die manager routine, Ready to close cached operation 1660, to properly close the last cache operation. A determination is made 1662 as to whether the last cache operation is a read operation or a write operation. If the last cache operation is a read operation, then a final transfer request 1664 (a die-specific atomic request) is added to the second request queue. If the last cache operation is a write operation, then a final program status check request 1666 (a die-specific atomic request) is added to the second request queue.

Figure 17:
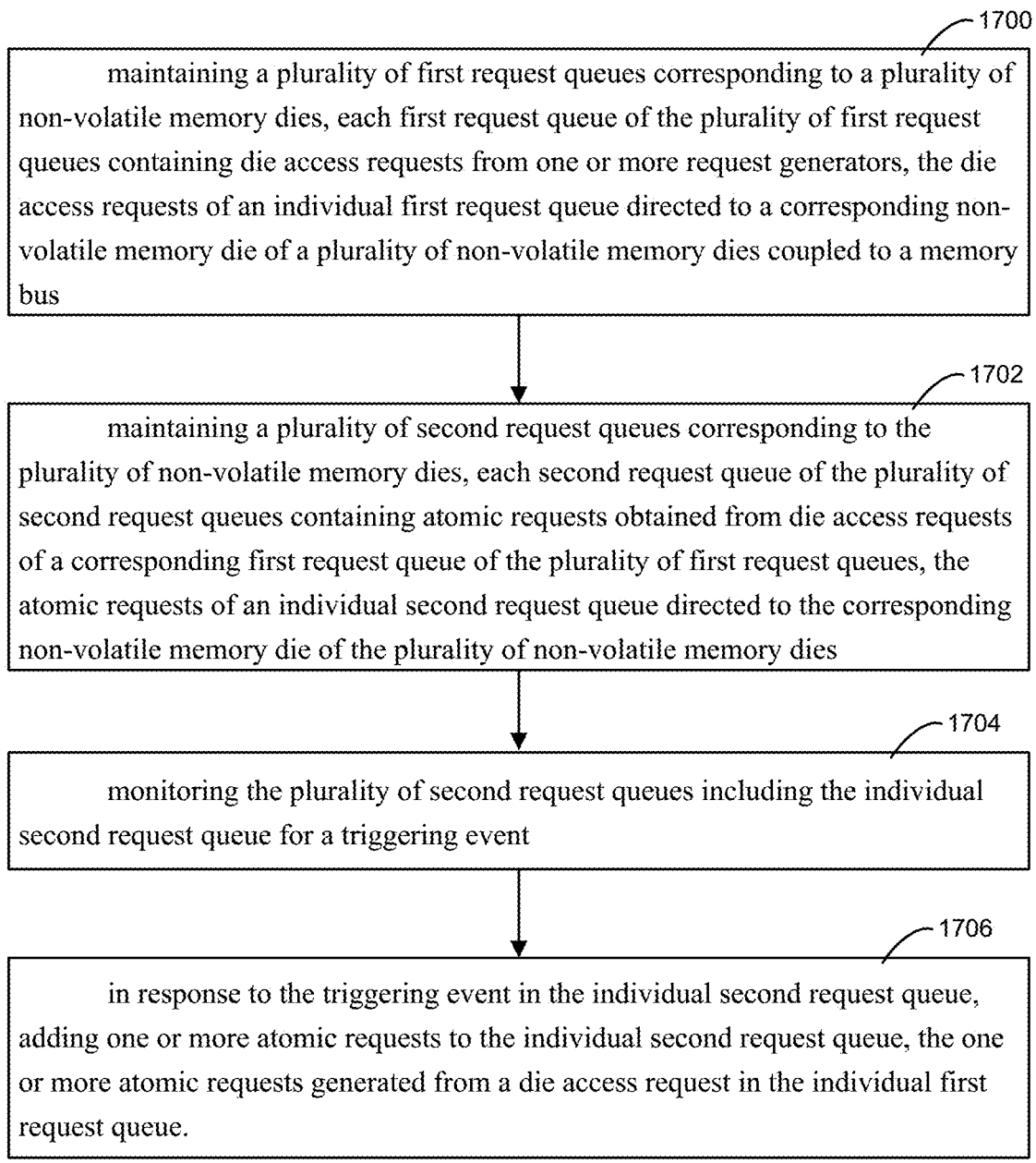
FIG. 17 illustrates an example of a method that includes adding atomic requests to a second request queue in response to a triggering event.

FIG. 17 shows an example of a method of operating a plurality of non-volatile memory dies such as non-volatile memory dies 502*a-e* of FIG. 5 or dies 0 to N of FIGS. 6-7. The method illustrated includes maintaining a plurality of first request queues corresponding to a plurality of non-volatile memory dies, each first request queue of the plurality of first request queues containing die access requests from one or more request generators, the die access requests of an individual first request queue directed to a corresponding non-volatile memory die of a plurality of non-volatile memory dies coupled to a memory bus 1700 and maintaining a plurality of second request queues corresponding to the plurality of non-volatile memory dies, each second request queue of the plurality of second request queues containing atomic requests obtained from die access requests of a corresponding first request queue of the plurality of first request queues, the atomic requests of an individual second request queue directed to the corresponding non-volatile memory die of the plurality of non-volatile memory dies 1702. The method further includes monitoring the plurality of second request queues including the individual second request queue for a triggering event 1704 and in response to the triggering event in the individual second request queue, adding one or more atomic requests to the individual second request queue, the one or more atomic requests generated from an access request in the individual first request queue 1706.

An example of a system includes a plurality of non-volatile memory dies, a memory bus coupled to the plurality of non-volatile memory dies, and one or more control circuits coupled to the plurality of non-volatile memory dies through the memory bus, the one or more control circuits including a plurality of die-specific request queues configured in a one-to-one correspondence with the plurality of non-volatile memory dies, the one or more control circuits configured to add die-specific atomic requests to individual die-specific request queues of the plurality of die-specific request queues independently of each other in response to die-specific triggering events.

The one or more control circuits may further include a timer configured to generate a die-specific triggering event for an individual die-specific request queue at the end of an elapsed time after sending of a prior die-specific atomic request from the individual die-specific request queue through the memory bus. The one or more control circuits may further include a plurality of die-specific state variable registers to indicate die-specific conditions and die-specific atomic requests may be added to an individual die-specific request queue according to conditions indicated by corresponding die-specific state variable registers. The plurality of die-specific state variable registers may indicate at least one of: cache enable status and a previous die-specific atomic request sent from a die-specific request queue through the memory bus. An individual die-specific request queue of the plurality of die-specific request queues may include a queue entry detector and a die-specific triggering event for the individual die-specific request queue may be a number of die-specific atomic requests detected by the queue entry detector dropping below a threshold number. A die-specific triggering event for an individual die-specific request queue may be completion of a last cache operation of a plurality of cache operations. The one or more control circuits may further comprise one or more request generators that generate die access requests directed to individual dies of the plurality of non-volatile memory dies and the one or more control circuits may be configured to generate a plurality of atomic requests in an individual die-specific request queue from an access request from a request generator. The one or more control circuits may be further configured to reorder atomic requests of die access requests from request generators. A non-volatile memory die of the plurality of non-volatile memory dies may include a non-volatile memory that is monolithically formed in one or more physical levels of arrays of memory cells having an active area disposed above a silicon substrate.

An example of a method includes: maintaining a plurality of first request queues corresponding to a plurality of non-volatile memory dies, each first request queue of the plurality of first request queues containing die access requests from one or more request generators, the die access requests of an individual first request queue directed to a corresponding non-volatile memory die of a plurality of non-volatile memory dies coupled to a memory bus; maintaining a plurality of second request queues corresponding to the plurality of non-volatile memory dies, each second request queue of the plurality of second request queues containing atomic requests obtained from die access requests of a corresponding first request queue of the plurality of first request queues, the atomic requests of an individual second request queue directed to the corresponding non-volatile memory die of the plurality of non-volatile memory dies; monitoring the plurality of second request queues including the individual second request queue for a triggering event; and in response to the triggering event in the individual second request queue, adding one or more atomic requests to the individual second request queue, the one or more atomic requests generated from an access request in the individual first request queue.

The method may further include adding a plurality of atomic requests to the individual second request queue, the plurality of atomic requests generated from a plurality of die access requests in the individual first request queue and may further include reordering the plurality of atomic requests prior to adding atomic requests to the individual second request queue and sending the plurality of atomic requests to the corresponding die for execution in order of the individual second request queue. The method may further include maintaining die state variables for each of the plurality of non-volatile memory dies and the one or more atomic requests are added to the individual second request queue according to the die state variables for the corresponding die, the die state variables including at least one of: read cache enable status, and write cache enable status. The method may further include adding to the second individual request queue atomic requests including: a data transfer request, a program request, and a check program status request generated from a write request in the individual first request queue. The method may further include adding to the second individual request queue atomic requests including: a read sense request and a data transfer request generated from a read request in the individual first request queue. The method may further include monitoring the individual second queue to identify when a write transfer request is sent from the individual second queue for execution; initiating a timer in response to sending the write transfer request from the individual second request queue for execution; and in response to expiration of the timer, adding a subsequent write transfer request to the individual second request queue. The method may further include, subsequent to initiating the timer and prior to expiration of the timer, adding a read sense request to the individual second request queue. The method may further include monitoring the individual second request queue to identify when a number of entries in the individual second request queue drops below a threshold and in response; in response to the number of entries in the individual second request queue dropping below a threshold, searching for entries in the individual first request queue; in response to finding at least one entry in the individual first request queue, generating at least one atomic request from the at least one entry in the individual first request queue; and adding at least one atomic request to the individual second request queue. The method may further include, in a three-level cell (TLC) non-volatile memory: monitoring the individual second queue to identify when a lower or middle page write transfer request is sent from the individual second queue for execution; and in response to sending of a lower or middle page write transfer request, adding a subsequent write transfer request for a corresponding middle or upper page to the individual second request queue.

An example of an apparatus includes: a plurality of non-volatile memory dies; a memory bus coupled to the plurality of non-volatile memory dies; a plurality of die-specific request queues configured to hold die-specific atomic requests for sending via the memory bus, the plurality of die-specific request queues configured in a one-to-one correspondence with the plurality of non-volatile memory dies such that each of the plurality of non-volatile memory dies has a corresponding die-specific request queue of the plurality of die-specific request queues; means for monitoring the plurality of die-specific request queues for triggering events and generating corresponding indicators of triggering events; and means for generating die-specific atomic requests from die-specific access requests and adding die-specific atomic requests to the plurality of die-specific request queues in response to the indicators of triggering events.

The apparatus may further include means for storing die-specific state information, the die-specific atomic requests added to the plurality of die-specific request queues according to die-specific state information relating to corresponding dies.

An example of a system includes a plurality of non-volatile memory dies, a memory bus coupled to the plurality of non-volatile memory dies, a memory control circuit coupled to the memory bus, the memory control circuit including: a plurality of first request queues corresponding to the plurality of non-volatile memory dies, each first request queue of the plurality of first request queues containing die access requests directed to a corresponding non-volatile memory die of the plurality of non-volatile memory dies; a plurality of second request queues corresponding to the plurality of non-volatile memory dies, each second request queue of the plurality of second request queues containing directed to the corresponding non-volatile memory die of the plurality of non-volatile memory dies; a data path manager configured to send atomic requests from the plurality of second request queues to corresponding non-volatile memory dies via the memory bus; and a die manager configured to generate atomic requests in the plurality of second request queues from die access requests in the plurality of first request queues in response to die-specific triggering events indicated by the data path manager.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A system comprising:
   a plurality of non-volatile memory dies;
   a memory bus coupled to the plurality of non-volatile memory dies; and
   one or more control circuits coupled to the plurality of non-volatile memory dies through the memory bus, the one or more control circuits including a plurality of first die-specific request queues configured in a one-to-one correspondence with the plurality of non-volatile memory dies and a plurality of second die-specific request queues configured in a one-to-one correspondence with the plurality of non-volatile memory dies, the one or more control circuits configured to add one or more die-specific atomic requests to individual second die-specific request queues of the plurality of second die-specific request queues in response to die-specific triggering events, the one or more die-specific atomic requests generated from an access request in a corresponding first die-specific request queue.

2. The system of claim 1 wherein the one or more control circuits further include a timer configured to generate a die-specific triggering event for an individual die-specific request queue at the end of an elapsed time after sending of a prior die-specific atomic request from the individual die-specific request queue through the memory bus.

3. The system of claim 1 wherein the one or more control circuits further include a plurality of die-specific state variable registers to indicate die-specific conditions and wherein die-specific atomic requests are added to an individual die-specific request queue according to conditions indicated by corresponding die-specific state variable registers.

4. The system of claim 3 wherein the plurality of die-specific state variable registers indicate at least one of: cache enable status and a previous die-specific atomic request sent from a die-specific request queue through the memory bus.

5. The system of claim 1 wherein an individual die-specific request queue of the plurality of die-specific request queues includes a queue entry detector and a die-specific triggering event for the individual die-specific request queue is a number of die-specific atomic requests detected by the queue entry detector dropping below a threshold number.

6. The system of claim 1 wherein a die-specific triggering event for an individual die-specific request queue is completion of a last cache operation of a plurality of cache operations.

7. The system of claim 1 wherein the one or more control circuits further comprise one or more request generators that generate die access requests directed to individual dies of the plurality of non-volatile memory dies and wherein the one or more control circuits are configured to generate a plurality of atomic requests in an individual die-specific request queue from an access request from a request generator.

8. The system of claim 7 wherein the one or more control circuits are further configured to reorder atomic requests of die access requests from request generators.

9. The system of claim 1 wherein a non-volatile memory die of the plurality of non-volatile memory dies includes a non-volatile memory that is monolithically formed in one or more physical levels of arrays of memory cells having an active area disposed above a silicon substrate.

10. A method comprising:
    maintaining a plurality of first request queues corresponding to a plurality of non-volatile memory dies, each first request queue of the plurality of first request queues containing die access requests from one or more request generators, the die access requests of an individual first request queue directed to a corresponding non-volatile memory die of a plurality of non-volatile memory dies coupled to a memory bus;
    maintaining a plurality of second request queues corresponding to the plurality of non-volatile memory dies, each second request queue of the plurality of second request queues containing atomic requests obtained from die access requests of a corresponding first request queue of the plurality of first request queues, the atomic requests of an individual second request queue directed to the corresponding non-volatile memory die of the plurality of non-volatile memory dies;
    monitoring the plurality of second request queues including the individual second request queue for a triggering event; and in response to the triggering event in the individual second request queue, adding one or more atomic requests to the individual second request queue, the one or more atomic requests generated from an access request in an individual first request queue.

11. The method of claim 10 further comprising adding a plurality of atomic requests to the individual second request queue, the plurality of atomic requests generated from a plurality of die access requests in the individual first request queue and further comprising reordering the plurality of atomic requests prior to adding atomic requests to the individual second request queue and sending the plurality of atomic requests to the corresponding non-volatile memory die for execution in order of the individual second request queue.

12. The method of claim 10 further comprising maintaining die state variables for each of the plurality of non-volatile memory dies and the one or more atomic requests are added to the individual second request queue according to the die state variables for the corresponding non-volatile memory die, the die state variables including at least one of: read cache enable status, and write cache enable status.

13. The method of claim 10 further comprising adding to the individual second request queue atomic requests including: a data transfer request, a program request, and a check program status request generated from a write request in the individual first request queue.

14. The method of claim 10 further comprising adding to the individual second request queue atomic requests including: a read sense request and a data transfer request generated from a read request in the individual first request queue.

15. The method of claim 10 further comprising:
monitoring the individual second queue to identify when a write transfer request is sent from the individual second request queue for execution;
initiating a timer in response to sending the write transfer request from the individual second request queue for execution; and
in response to expiration of the timer, adding a subsequent write transfer request to the individual second request queue.

16. The method of claim 15 further comprising, subsequent to initiating the timer and prior to expiration of the timer, adding a read sense request to the individual second request queue.

17. The method of claim 10 further comprising:
monitoring the individual second request queue to identify when a number of entries in the individual second request queue drops below a threshold;
in response to the number of entries in the individual second request queue dropping below a threshold, searching for entries in the individual first request queue;
in response to finding at least one entry in the individual first request queue, generating at least one atomic request from the at least one entry in the individual first request queue; and
adding at least one atomic request to the individual second request queue.

18. The method of claim 10 further comprising, in a three-level cell (TLC) non-volatile memory:
monitoring the individual second request queue to identify when a lower or middle page write transfer request is sent from the individual second request queue for execution; and in response to sending of a lower or middle page write transfer request, adding a subsequent write transfer request for a corresponding middle or upper page to the individual second request queue.

19. An apparatus comprising:
a plurality of non-volatile memory dies;
a memory bus coupled to the plurality of non-volatile memory dies;
a plurality of first die-specific request queues configured to hold die-specific access requests, the plurality of first die-specific request queues configured in a one-to-one correspondence with the plurality of non-volatile memory dies such that each of the plurality of non-volatile memory dies has a corresponding first die-specific request queue of the plurality of die-specific request queues;
a plurality of second die-specific request queues configured to hold die-specific atomic requests for sending via the memory bus, the plurality of second die-specific request queues configured in a one-to-one correspondence with the plurality of non-volatile memory dies such that each of the plurality of non-volatile memory dies has a corresponding second die-specific request queue of the plurality of die-specific request queues;
means for monitoring the plurality of second die-specific request queues for triggering events and generating indicators of triggering events; and
means for generating die-specific atomic requests from die-specific access requests and adding die-specific atomic requests to the plurality of second die-specific request queues in response to the indicators of triggering events.

20. The apparatus of claim 19 further comprising:
means for storing die-specific state information, the die-specific atomic requests added to the plurality of die-specific request queues according to die-specific state information relating to corresponding dies.

21. A system comprising:
a plurality of non-volatile memory dies;
a memory bus coupled to the plurality of non-volatile memory dies;
a memory control circuit coupled to the memory bus, the memory control circuit comprising:
a plurality of first request queues corresponding to the plurality of non-volatile memory dies, each first request queue of the plurality of first request queues containing die access requests directed to a corresponding non-volatile memory die of the plurality of non-volatile memory dies;
a plurality of second request queues corresponding to the plurality of non-volatile memory dies, each second request queue of the plurality of second request queues containing directed to the corresponding non-volatile memory die of the plurality of non-volatile memory dies;
a data path manager configured to send atomic requests from the plurality of second request queues to corresponding non-volatile memory dies via the memory bus; and
a die manager configured to generate atomic requests in the plurality of second request queues from die access requests in the plurality of first request queues in response to die-specific triggering events indicated by the data path manager.

* * * * *